(12) United States Patent
Huang et al.

(10) Patent No.: US 12,438,007 B2
(45) Date of Patent: Oct. 7, 2025

(54) STAGGERED METAL MESH ON BACKSIDE OF DEVICE DIE AND METHOD FORMING SAME

(71) Applicant: Taiwan Semiconductor Manufacturing Co., Ltd., Hsinchu (TW)

(72) Inventors: Tzu-Sung Huang, Tainan (TW); Tsung-Hsien Chiang, Hsinchu (TW); Ming Hung Tseng, Toufen Township (TW); Hao-Yi Tsai, Hsinchu (TW); Yu-Hsiang Hu, Hsinchu (TW); Chih-Wei Lin, Zhubei (TW); Lipu Kris Chuang, Hsinchu (TW); Wei Lun Tsai, Kaohsiung (TW); Kai-Ming Chiang, Hsinchu (TW); Ching Yao Lin, Taichung (TW); Chao-Wei Li, Hsinchu (TW); Ching-Hua Hsieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 543 days.

(21) Appl. No.: 17/655,645

(22) Filed: Mar. 21, 2022

(65) Prior Publication Data
US 2023/0154764 A1  May 18, 2023

Related U.S. Application Data

(60) Provisional application No. 63/278,522, filed on Nov. 12, 2021.

(51) Int. Cl.
H01L 23/49 (2006.01)
H01L 21/48 (2006.01)
(Continued)

(52) U.S. Cl.
CPC .... H01L 21/4857 (2013.01); H01L 23/49822 (2013.01); H01L 23/49838 (2013.01);
(Continued)

(58) Field of Classification Search
None
See application file for complete search history.

(56) References Cited

U.S. PATENT DOCUMENTS 9,576,926 B2 * 2/2017 Yu .............. H01L 23/5384
9,607,967 B1 * 3/2017 Shih ............ H01L 21/6835
(Continued)

FOREIGN PATENT DOCUMENTS

JP 2006216770 A 8/2006
JP 2007318060 A 12/2007
(Continued)

Primary Examiner — Bilkis Jahan
(74) Attorney, Agent, or Firm — Slater Matsil, LLP

(57) ABSTRACT

A method includes forming a first metal mesh over a carrier, forming a first dielectric layer over the first metal mesh, and forming a second metal mesh over the first dielectric layer. The first metal mesh and the second metal mesh are staggered. The method further includes forming a second dielectric layer over the second metal mesh, attaching a device die over the second dielectric layer, with the device die overlapping the first metal mesh and the second metal mesh, encapsulating the device die in an encapsulant, and forming redistribution lines over and electrically connecting to the device die.

20 Claims, 25 Drawing Sheets

(51) Int. Cl.
   *H01L 23/498*   (2006.01)
   *H01L 23/00*   (2006.01)
(52) U.S. Cl.
   CPC .............. *H01L 24/24* (2013.01); *H01L 24/32* (2013.01); *H01L 24/73* (2013.01); *H01L 24/82* (2013.01); *H01L 24/83* (2013.01); *H01L 24/92* (2013.01); *H01L 2224/24227* (2013.01); *H01L 2224/32225* (2013.01); *H01L 2224/73267* (2013.01); *H01L 2224/82005* (2013.01); *H01L 2224/83005* (2013.01); *H01L 2224/92244* (2013.01)

(56) References Cited

U.S. PATENT DOCUMENTS

| | | | |
|---|---|---|---|
| 10,467,450 | B2 | 11/2019 | Kim et al. |
| 10,825,778 | B2 | 11/2020 | Bae et al. |
| 2006/0214190 | A1* | 9/2006 | Chun ................ H01L 23/49822 |
| | | | 257/E23.114 |
| 2014/0262475 | A1* | 9/2014 | Liu ..................... H01L 21/4817 |
| | | | 174/377 |
| 2015/0287700 | A1* | 10/2015 | Yu ........................... H01L 24/19 |
| 2016/0343645 | A1 | 11/2016 | Pan et al. |
| 2018/0366407 | A1 | 12/2018 | Ooi et al. |
| 2019/0229055 | A1* | 7/2019 | So ......................... H10F 39/804 |
| 2020/0075503 | A1* | 3/2020 | Chuang ................. H01L 25/165 |
| 2020/0287271 | A1 | 9/2020 | Lu et al. |

FOREIGN PATENT DOCUMENTS

| | | |
|---|---|---|
| TW | 201926592 A | 7/2019 |
| TW | 201933564 A | 8/2019 |
| TW | 202015210 A | 4/2020 |

\* cited by examiner

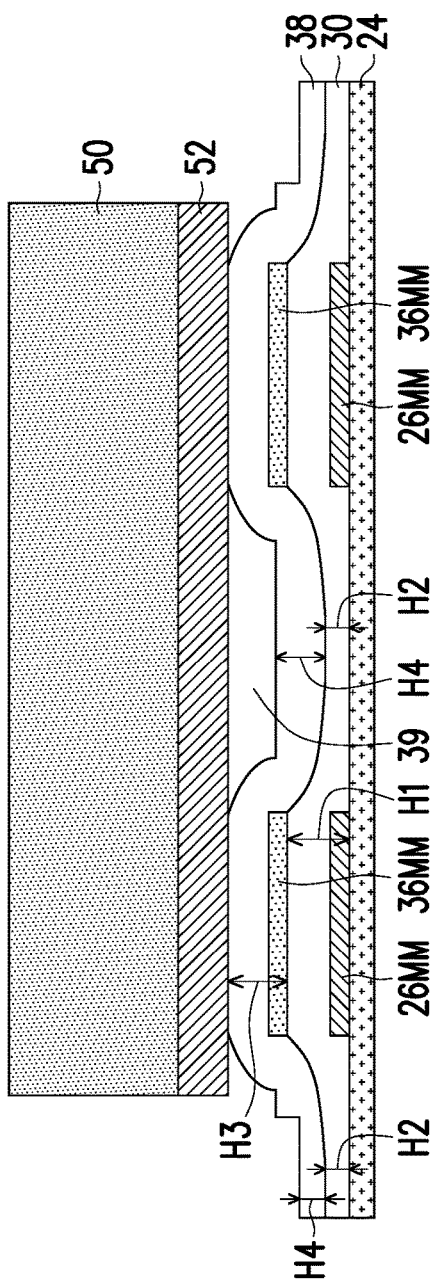
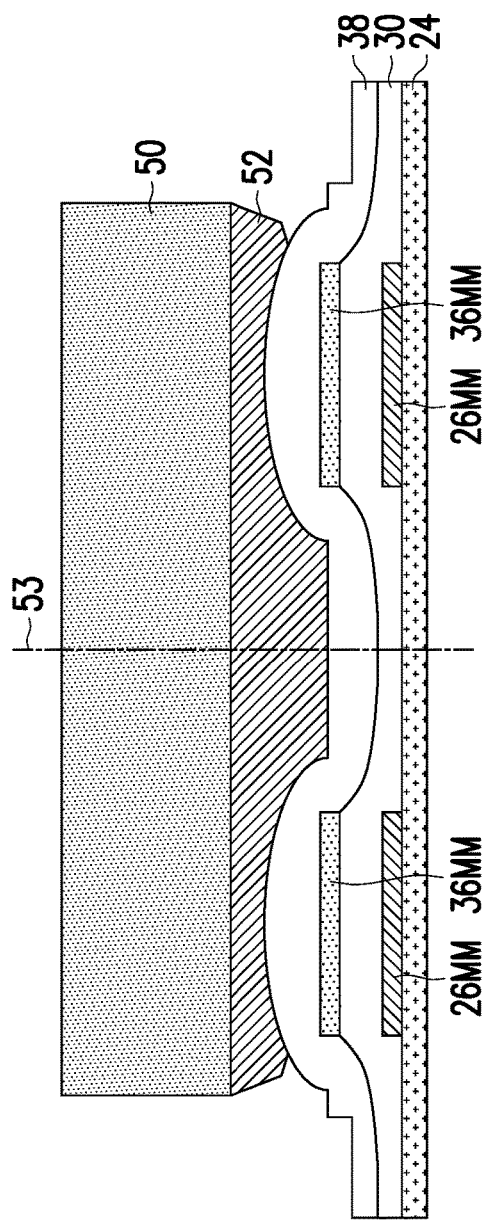

STAGGERED METAL MESH ON BACKSIDE OF DEVICE DIE AND METHOD FORMING SAME

PRIORITY CLAIM AND CROSS-REFERENCE

This application claims the benefit of the following provisionally filed U.S. Patent application: Application No. 63/278,522, filed on Nov. 12, 2021, and entitled "Innovative Backside RDL Design," which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

In some packaging processes, device dies are sawed from wafers before they are packaged, wherein redistribution lines are formed to connect to the device dies. An advantageous feature of this packaging technology is the possibility of forming fan-out packages, which means the I/O pads on a die can be redistributed to a greater area than the die, and hence the number of I/O pads on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 25-26 illustrate the cross-sectional views of voids that may be formed between a die-attach film and the underlying dielectric layer and the consequence in accordance with some embodiments.

DETAILED DESCRIPTION

Figure 1:
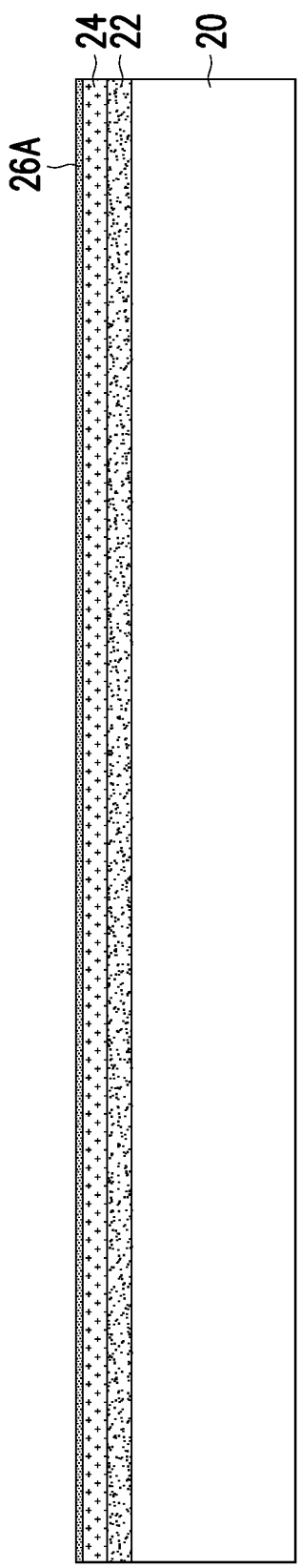
FIGS. 1-14 illustrate the cross-sectional views of intermediate stages in the formation of a package including metal meshes in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including staggered metal meshes and the method of forming the same are provided. In accordance with some embodiments of the present disclosure, the staggered metal meshes are formed first, and a dielectric layer is formed to cover the staggered metal meshes. A device die is attached directly over the dielectric layer through a die-attach film. With the metal meshes being staggered, the topology of the dielectric layer is reduced, and the possibility of forming voids between the dielectric layer and the die-attach film is reduced or eliminated. This may result in reduced warpage of the die-attach film and the device die. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 29:
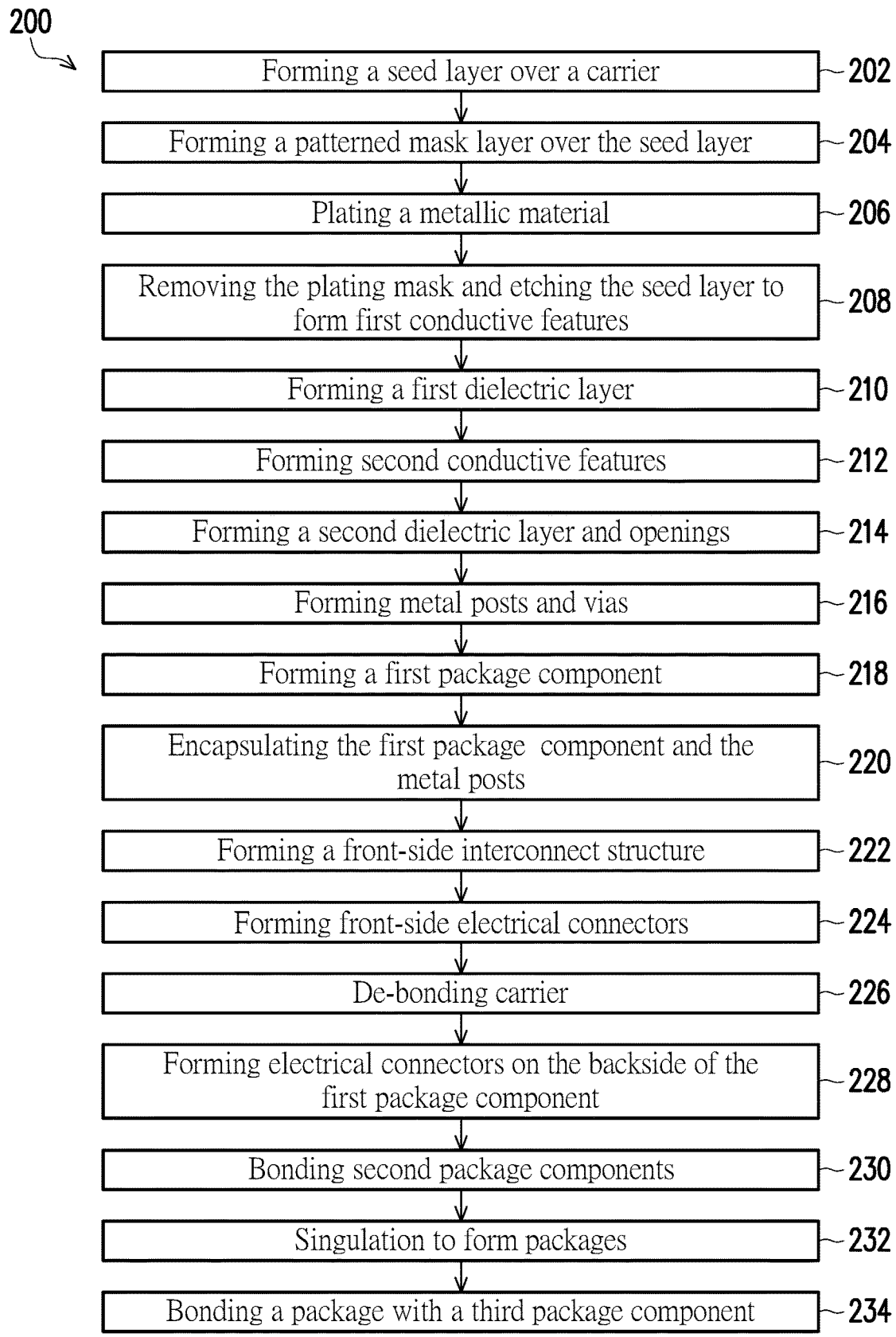
FIG. 29 illustrates a process flow for forming a package including staggered metal meshes in accordance with some embodiments.

FIGS. 1 through 14 illustrate the cross-sectional views of intermediate stages in the formation of a package including staggered metal meshes in accordance with some embodiments of the present disclosure. The corresponding processes are also reflected schematically in the process flow shown in FIG. 29.

Referring to FIG. 1, carrier 20 is provided, and release film 22 is coated on carrier 20. Carrier 20 is formed of a transparent material, and may be a glass carrier, a ceramic carrier, or the like. Release film 22 may be formed of a Light-To-Heat-Conversion (LTHC) coating material, and may be applied onto carrier 20 through coating. In accordance with some embodiments of the present disclosure, the LTHC coating material is capable of being decomposed under the heat of light/radiation (such as laser), and hence can release carrier 20 from the structure formed thereon.

In accordance with some embodiments, as shown in FIG. 1, dielectric layer 24 is formed on release film 22. Dielectric layer 24 may be formed of or comprise a polymer such as polybenzoxazole (PBO), polyimide, benzocyclobutene (BCB), or the like.

Metal seed layer 26A is deposited over dielectric layer 24. The respective process is illustrated as process 202 in the process flow 200 shown in FIG. 29. In accordance with some embodiments, metal seed layer 26A includes a titanium layer and a copper layer over the titanium layer. The metal seed layer may be formed through, for example, Physical Vapor Deposition (PVD), Chemical Vapor Deposition (CVD), or the like.

Figure 2:
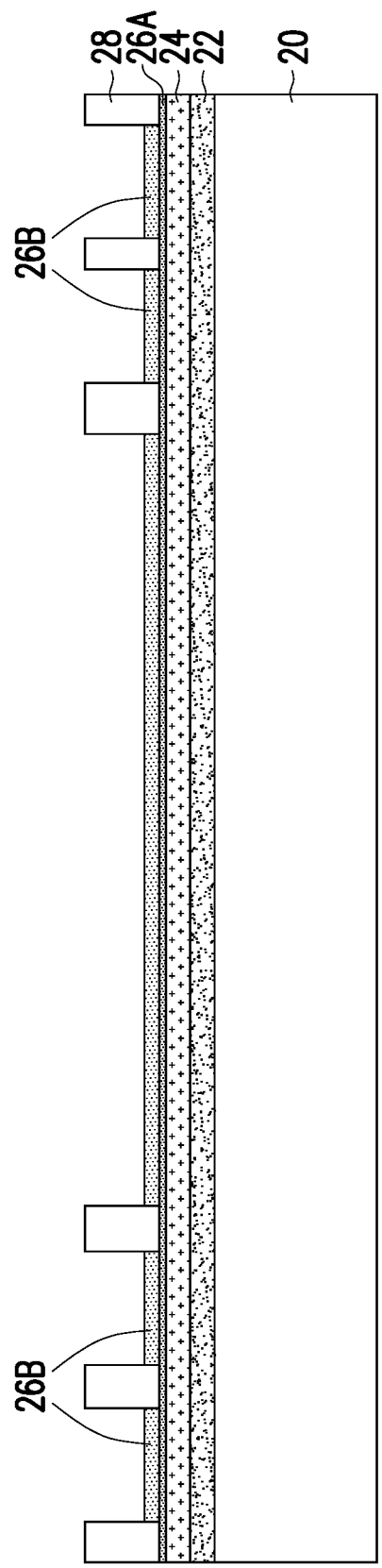

Next, as shown in FIG. 2, a patterned plating mask 28 is applied and patterned. The respective process is illustrated as process 204 in the process flow 200 shown in FIG. 29. In accordance with some embodiments, the patterned plating mask 28 comprises a patterned photo resist. In accordance with alternative embodiments, plating mask 28 comprises a dry film, which is laminated and then patterned. Some portions of metal seed layer 26A are exposed through the patterned plating mask 28.

Next, metallic material 26B is deposited on the exposed portions of metal seed layer 26A. The respective process is illustrated as process 206 in the process flow 200 shown in FIG. 29. The deposition process may include a plating process, which may be an electro-chemical plating process, an electro-less plating process, or the like. Metallic material 26B may include Cu, Al, Ti, W, Au, or the like. After the plating process, the patterned plating mask 28 is removed, exposing the underlying portions of metal seed layer 26A. The respective process is illustrated as process 208 in the process flow 200 shown in FIG. 29.

Figure 3:
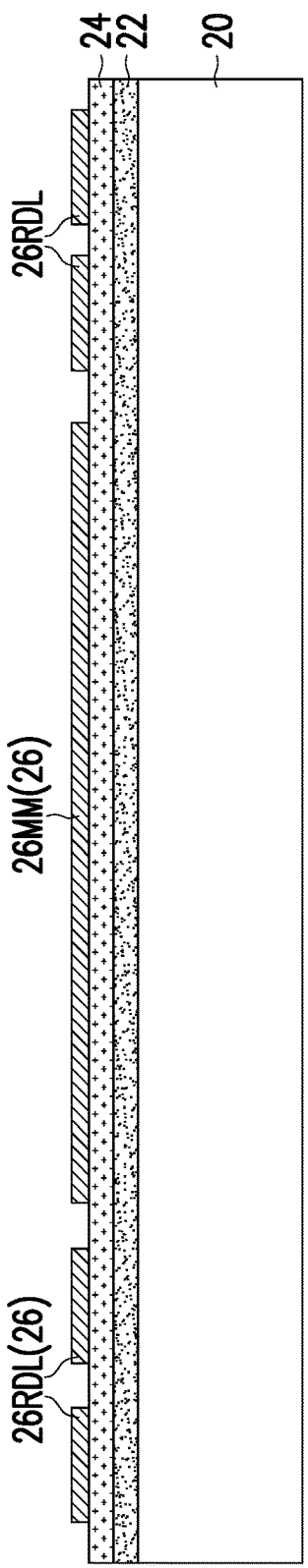

The exposed portions of metal seed layer 26A are then removed, leaving metal mesh 26MM and RDL 26RDL as shown in FIG. 3. The respective process is also illustrated as process 208 in the process flow 200 shown in FIG. 29. Throughout the description, metal mesh 26MM and RDLs 26RDL are collectively referred to as metal layer 26 or conductive features 26. Metal mesh 26MM and RDL 26RDL include the remaining portions of metal seed layer 26A and the plated metallic material 26B. Metal mesh 26MM is alternatively referred to as a metal plate.

Figure 15:
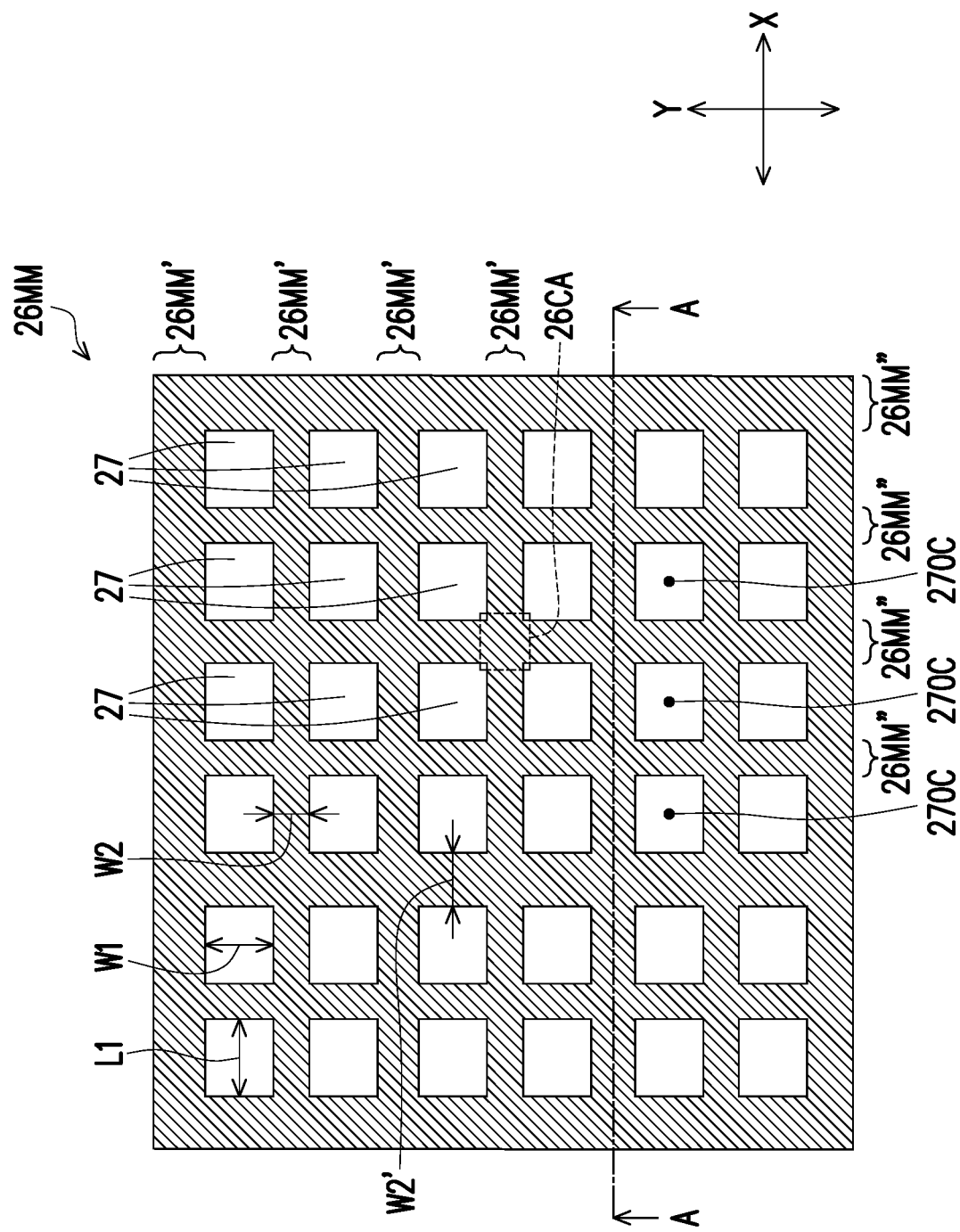
FIGS. 15-17 illustrate the top views of staggered metal meshes in accordance with some embodiments.

FIG. 15 illustrates an example top view of metal mesh 26MM. The cross-sectional view of metal mesh 26MM shown in FIG. 3 is obtained from cross-section A-A in FIG. 15. In accordance with some embodiments, the metal mesh 26MM includes a plurality of strips 26MM' having lengthwise directions in the X-direction, and a plurality of strips 26MM" having lengthwise directions in the Y-direction, which may be (or may not be) perpendicular to the X-direction. The plurality of strips 26MM' and 26MM" define a plurality of openings 27 therein. In accordance with some embodiments, the plurality of openings 27 form an array, and may have same sizes. The plurality of strips 26MM' and 26MM" have crossing areas 26CA (with one marked), which are the areas in which the plurality of strips 26MM' overlap the plurality of strips 26MM".

In accordance with some embodiments of the present disclosure, the length Li and width W1 of openings 27 may be in the range between about 10 μm and about 30 μm. The width W2 of metal strips 26MM' and width W2' of metal mesh 26MM" may also be in the range between about 10 μm and about 30 μm.

Figure 4:
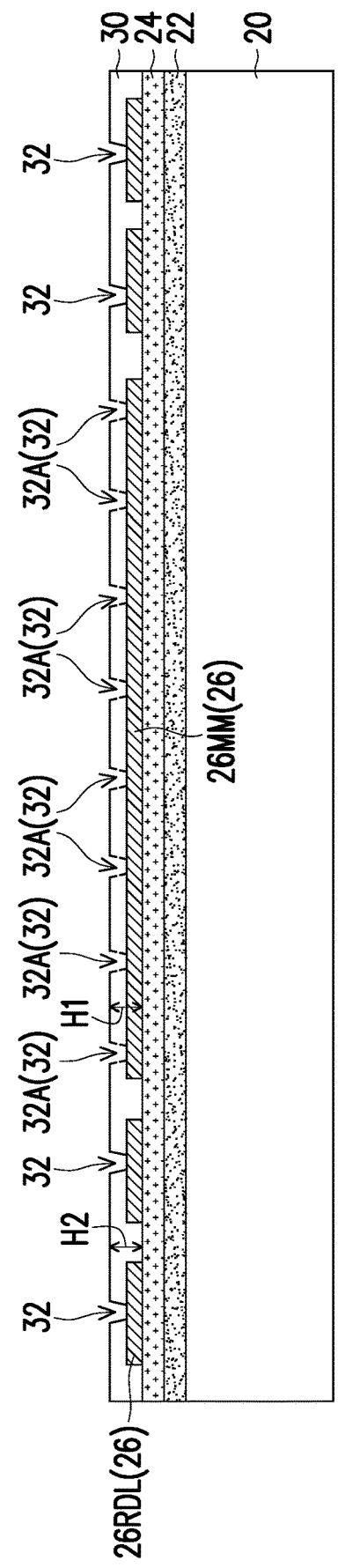

Referring to FIG. 4, dielectric layer 30 is formed on metal mesh 26MM and RDLs 26RDL. The respective process is illustrated as process 210 in the process flow 200 shown in FIG. 29. The bottom surface of dielectric layer 30 is in contact with the top surfaces of metal mesh 26MM, RDLs 26RDL, and dielectric layer 24. In accordance with some embodiments of the present disclosure, dielectric layer 30 is formed of or comprises a polymer, which may be a photosensitive material such as PBO, polyimide, BCB, or the like. In accordance with alternative embodiments, dielectric layer 30 is formed of an inorganic dielectric material, which may include a nitride such as silicon nitride, or an oxide such as silicon oxide, phosphosilicate glass (PSG), borosilicate glass (BSG), boron-doped phosphosilicate glass (BPSG), fluorine-doped silicate glass (FSG), or the like.

In accordance with some embodiments, the formation of dielectric layer 30 includes dispensing dielectric layer 30 in a flowable form, and then curing the flowable dielectric layer 30 to solidify it. Dielectric layer 30 includes first portions overlapping the metal portions of metal mesh 26MM and RDLs 26RDL, which first portions have height H1. Dielectric layer 30 further includes second portions offset (vertically misaligned) from the metal portions of metal mesh 26MM and RDLs 26RDL, which second portions have height H2. Since dielectric layer 30 has a certain viscosity value, height H1 is greater than height H2. In accordance with some embodiments, the height difference (H1–H2) may be in the range between about 1 μm and about 2 μm, while greater or smaller height difference may be possible, depending on the viscosity of dielectric layer 30 (when dispensed) and the thickness of metal mesh 26MM and RDLs 26RDL.

Dielectric layer 30 is then patterned to form openings 32 therein. Hence, some pad portions of RDLs 26RDL are exposed through openings 32. In accordance with some embodiments, there is no via formed over and exposing metal mesh 32MM. In accordance with alternative embodiments, metal mesh 26MM is connected to the overlying metal mesh through vias. Accordingly, some via openings 32 (marked as 32A) may be formed over and exposing metal mesh 32MM. Via openings 32A are shown as being dashed to indicate that they may be, or may not be, formed.

Figure 5:
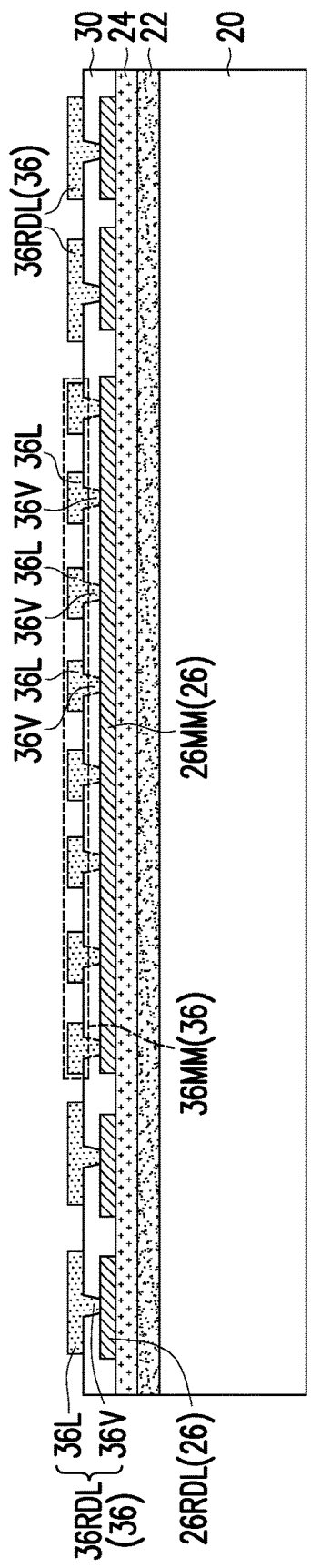

FIG. 5 illustrates the formation of conductive features 36 (which are also collectively referred to as metal layer 36), which include metal mesh 36MM and RDLs 36RDL. The respective process is illustrated as process 212 in the process flow 200 shown in FIG. 29. Each of (or some of) the conductive features 36 may include a via portion and a line portion. For example, RDLs 36RDL may include line portions 36L over dielectric layer 30 and vias portion (also referred to as vias) 36V in dielectric layer 30. In accordance with some embodiments, no vias are formed underlying and connecting metal mesh 36MM to metal mesh 26MM. In accordance with alternative embodiments, metal mesh 36MM also include line portions 36L and the corresponding via portions 36V. Via portions 36V directly underlying metal mesh 36MM are thus shown as being dashed to indicate that they may be, or may not be, formed. RDLs 36RDL are in contact with the respective underlying RDLs 26RDL. The formation of conductive features 36 may adopt the methods and materials similar to those for forming metal mesh 26MM and RDLs 26RDL. Also, each of vias 36V may have a tapered profile, with the upper portions being wider than the corresponding lower portions.

Figure 16:
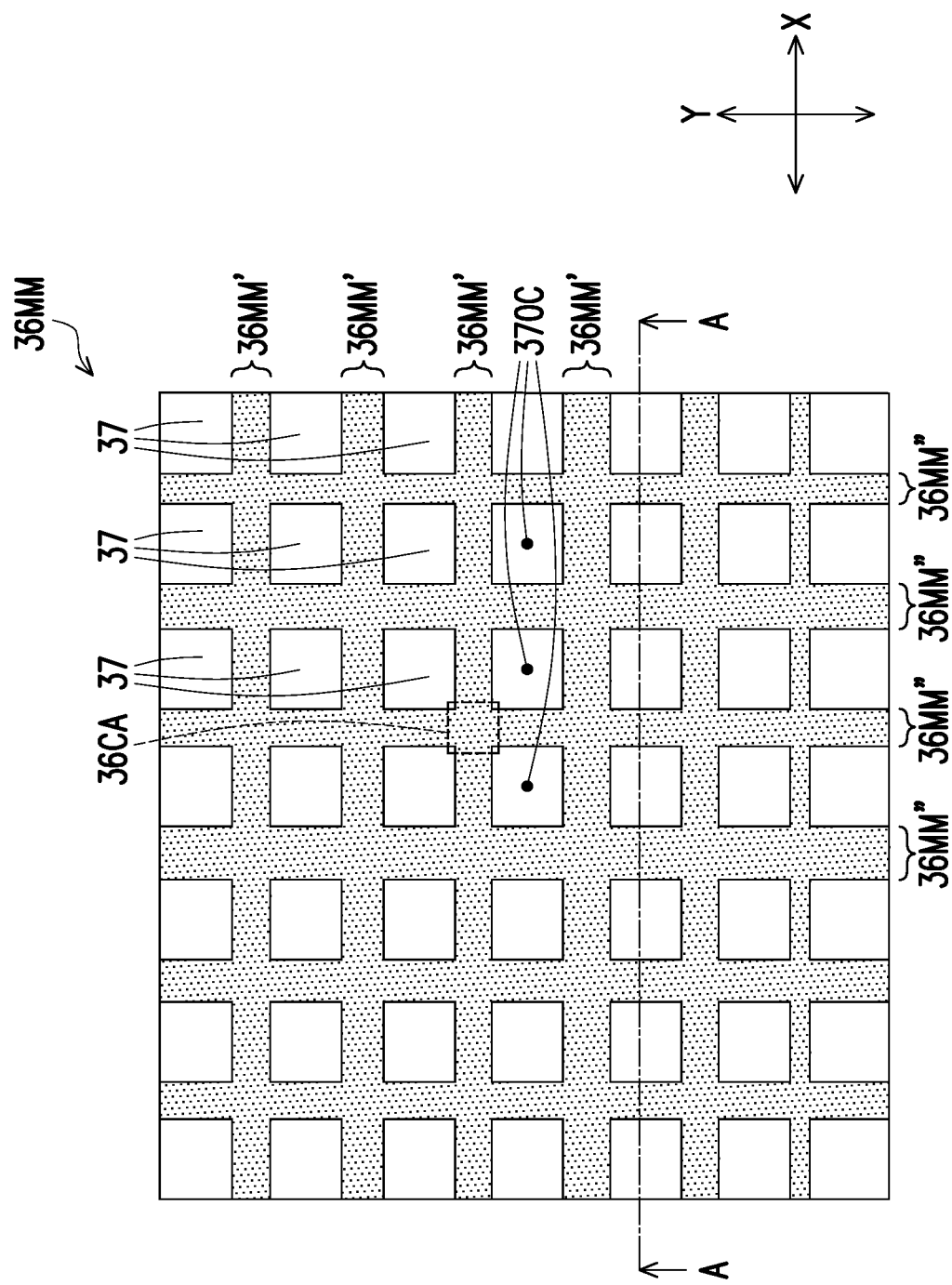

FIG. 16 illustrates an example top view of metal mesh 36MM. The metal mesh 36MM shown in FIG. 5 is obtained from cross-section A-A in FIG. 16. In accordance with some embodiments, the metal mesh 36MM includes a plurality of strips 36MM' having lengthwise directions in the X-direction, and a plurality of strips 36MM" having lengthwise directions in the Y-direction, which may be (or may not be) perpendicular to the X-direction. The plurality of strips 36MM' and 36MM" define a plurality of openings 37 therein. In accordance with some embodiments, the plurality of openings 37 form an array, and may have same sizes. The plurality of strips 36MM' and 36MM" have crossing areas 36CA (with one marked), which are the areas in which the plurality of strips 36MM' overlap the plurality of strips 36MM". The dimensions of openings 37 may be in the range between about 10 μm and about 30 μm. The widths of strips 36MM' and 36MM" may also be in the range between about 10 μm and about 30 μm. The widths of strips 36MM' and 36MM" may also be equal to the widths of strips 26MM' and 26MM".

Figure 17:
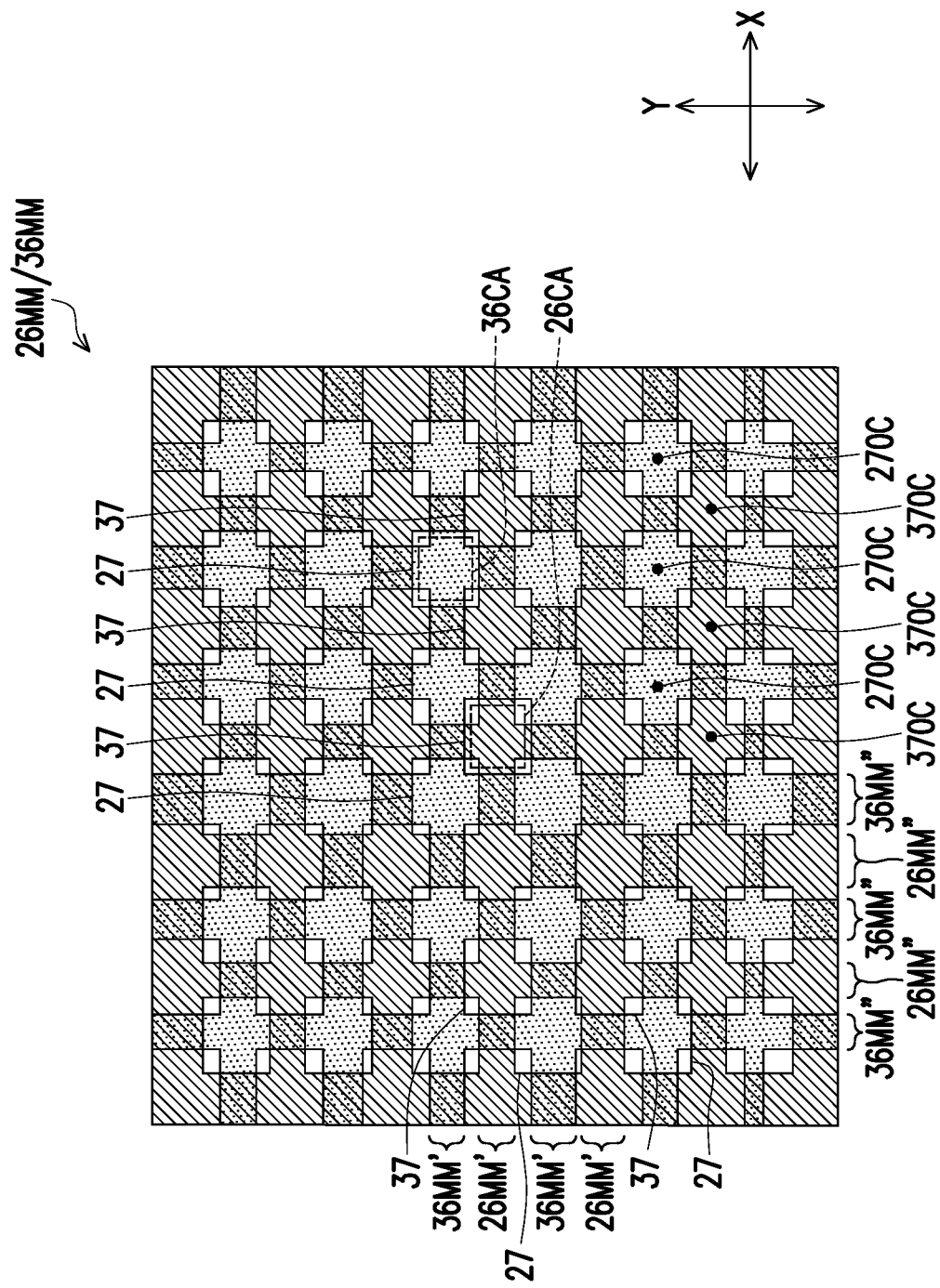

FIG. 17 illustrates a top view of both of metal meshes 26MM and 36MM in accordance with some embodiments. Metal mesh 36MM is staggered from the underlying metal mesh 26MM. Accordingly, strips 26MM' are offset from (while may be parallel to) strips 36MM', and strips 26MM" are offset from (while may be parallel to) strips 36MM". Openings 27 in metal mesh 26MM may be offset from the openings 37 in metal mesh 36MM. In accordance with some embodiments, openings 37 in metal mesh 36MM are directly over crossing areas 26CA of metal mesh 26MM. Crossing area 36CA in metal mesh 36MM may be directly over, and may overlap parts of openings 27 in metal mesh 26MM. Alternatively stated, the crossing areas 36CA of metal mesh 36MM are vertically (when viewed in FIG. 5) aligned to the openings 27 in metal mesh 26MM, and the crossing areas 26CA of metal mesh 26MM are vertically aligned to the openings 37 in metal mesh 36MM. Accordingly, metal meshes 26MM and 36MM are referred to as staggered metal meshes. Also, in the top view, the centers 370C of openings 37 may (or may not) overlap the centers of the corresponding crossing area 26CA, and the centers 270C of openings 27 may (or may not) overlap the centers of the corresponding crossing area 36CA. In accordance with some embodiments of the present disclosure, in the top view, metal meshes 26MM and 36MM in combination occupy between about 50 and about 80 percent of the chip area, while the overlap areas of openings 27 and 37 occupy about 20 and about 50 percent of the chip area.

Figure 6:
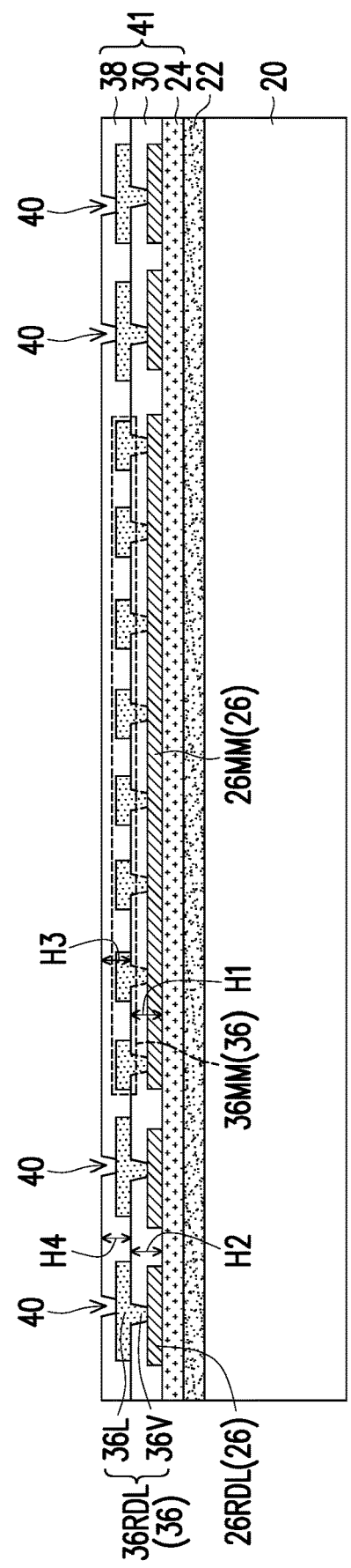

FIG. 6 illustrates the formation of dielectric layer 38. Openings 40 are formed in dielectric layer 38 to expose the underlying RDLs 36RDL. The respective processes are illustrated as process 214 in the process flow 200 shown in FIG. 29. In accordance with some embodiments of the present disclosure, dielectric layer 38 is formed of a material selected from the same group of candidate materials for forming dielectric layers 30 and 24, and may include organic materials, as aforementioned. It is appreciated that although in the illustrated example embodiments, two dielectric layers 30 and 38, and the respective conductive features 26 and 36 are discussed as examples, fewer or more dielectric layers and conductive layers may be adopted, depending on the signal routing requirement. Throughout the description, conductive features 26 and 36 and dielectric layers 24, 30 and 38 are collectively referred to as backside interconnect structure 41, which is on the backside of the subsequently placed device die.

The formation of dielectric layer 38 may include dispensing dielectric layer 38 in a flowable form, and then curing the flowable dielectric layer 38 to solidify it. Dielectric layer 38 has first portions overlapping the metal portions of metal mesh 36MM and RDLs 36RDL, which first portions have height H3. Dielectric layer 38 further includes second portions offset from the metal portions of metal mesh 36MM and RDLs 36RDL, which second portions have height H4. Since dielectric layer 38 has a certain viscosity value, height H3 is greater than height H4. In accordance with some embodiments, the height difference (H3–H4) may be in the range between about 1 μm and about 2 μm, while greater or smaller height difference may be possible depending on the viscosity of dielectric layer and the thickness of metal mesh 36MM and RDLs 36RDL.

Figure 7:
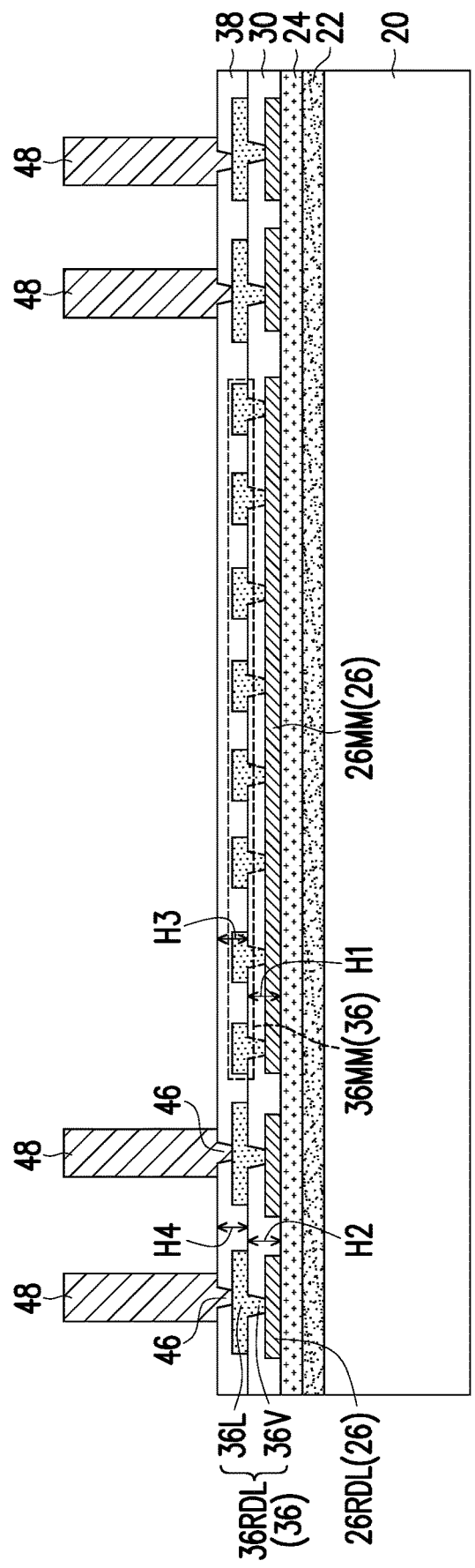

Referring to FIG. 7, vias 46 are formed in openings 40, and metal posts 48 are formed over and joined with vias 46. The respective process is illustrated as process 216 in the process flow 200 shown in FIG. 29. Vias 46 and metal posts 48 may be formed in common formation processes. In accordance with some embodiments, the formation processes include depositing a metal seed layer, forming a plating mask (not shown) over the metal seed layer, plating a metallic material in the openings in the plating mask, removing the plating mask, and etching the portions of the metal seed layer previously covered by the plating mask. In accordance with some embodiments of the present disclosure, the metal seed layer may include a titanium layer and a copper layer over the titanium layer. The formation of the metal seed layer may include PVD, CVD, or the like. The plating mask may include photo resist. The plated metallic material may include copper or a copper alloy, tungsten, or the like. The plated metallic material and the remaining portions of the metal seed layer thus form vias 46 and the metal posts 48.

Figure 8:
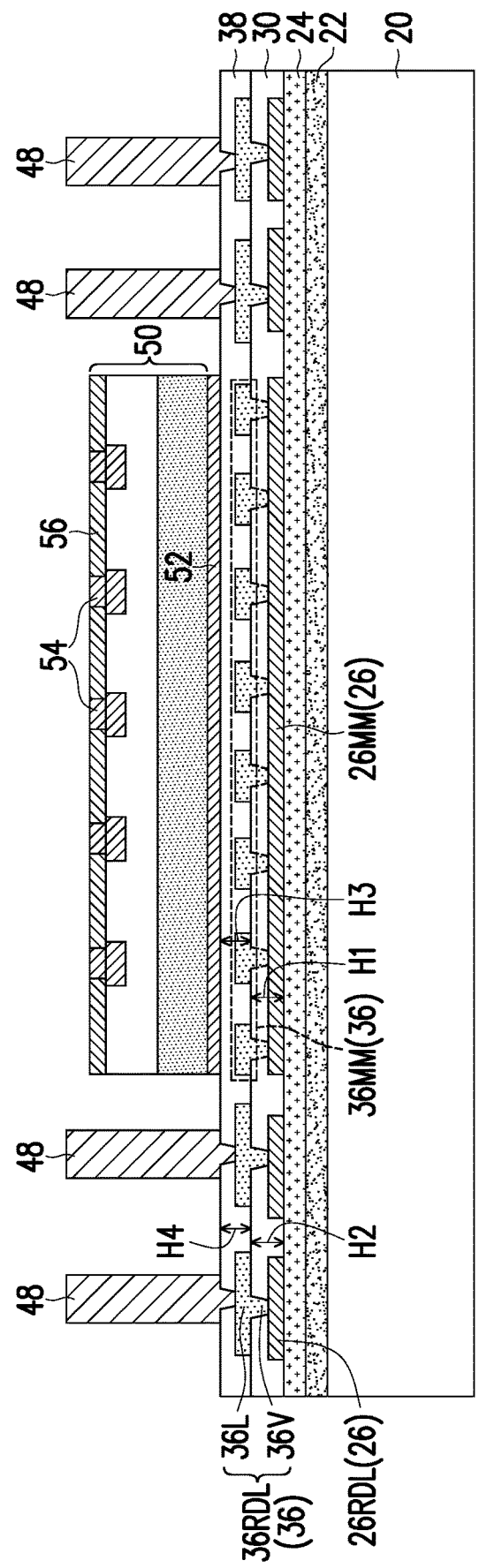

FIG. 8 illustrates the placement/attachment of package component 50, with Die-Attach Film (DAF) 52 being used to adhere package component 50 to dielectric layer 38. The respective process is illustrated as process 218 in the process flow 200 shown in FIG. 29. Although one package component 50 is illustrated, there may be a plurality of package components being placed, which may be the same as each other or different from each other. In accordance with some embodiments, package component 50 is a device die, a package with a device die(s) packaged therein, a System-on-Chip (SoC) die including a plurality of integrated circuits (or device dies) integrated as a system, or the like. The device die in package component 50 may be or may include a logic die, a memory die, an input-output die, an Integrated Passive Device (IPD), or the like, or combinations thereof. For example, the logic die in package component 50 may be a Central Processing Unit (CPU) die, a Graphic Processing Unit (GPU) die, a mobile application die, a Micro Control Unit (MCU) die, a BaseBand (BB) die, an Application processor (AP) die, or the like. The memory die in package component 50 may include a Static Random Access Memory (SRAM) die, a Dynamic Random Access Memory (DRAM) die, or the like. Package component 50 may include dielectric layer 56 and electrical connectors 54 (such as metal pillars, micro-bumps, and/or bond pads) embedded in dielectric layer 56.

If metal mesh 26MM is vertically aligned to metal mesh 36MM, the openings 37 in metal mesh 36MM (FIG. 16) will overlap the openings 27 in metal mesh 26MM (FIG. 15). Due to the height difference between heights H1 and H2, and the height difference between height H3 and H4, the top surface of dielectric layer 38 has a high topology, as can be found in FIG. 25. FIG. 25 shows that in the regions where there are both of metal portions of metal meshes 26MM and 36MM, the total height of dielectric layers 30 and 38 is (H1+H3). In the regions where there are no metal portions of metal meshes 26MM and 36MM, the total height of dielectric layers 30 and 38 is (H2+H4), as shown in FIG. 25. The total height (H2+H4) is significantly smaller than total height (H1+H2). Accordingly, there is significant topology in the top surface of dielectric layer 38. Voids 39 may be trapped between DAF 52 and dielectric layer 38. In subsequent curing processes, as shown schematically in FIG. 26, when DAF 52 is cured, the voids 39 cause significant shrinking of DAF 52 toward the center line 53 due to the significant volume of voids 39.

Figure 27:
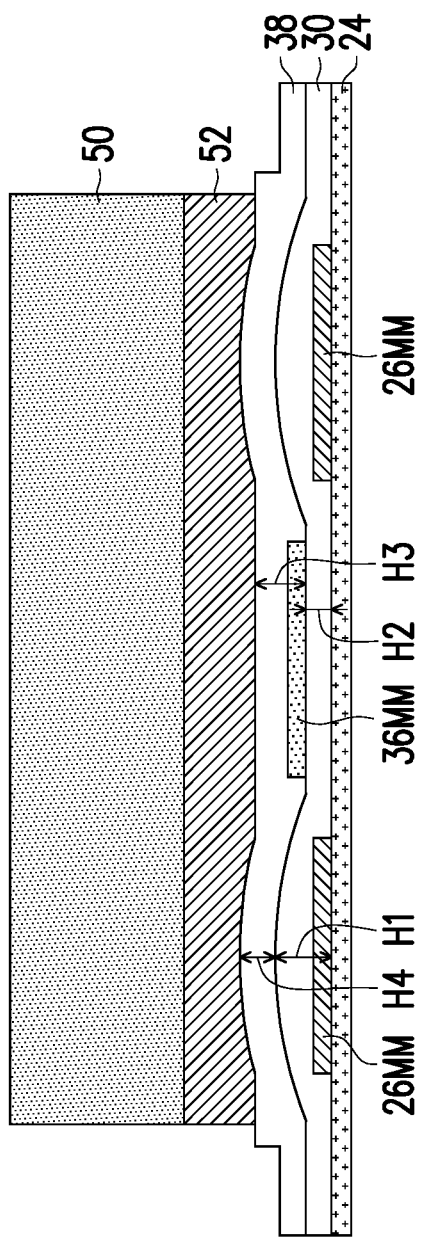
FIG. 27 illustrates the cross-sectional view of a package including staggered metal meshes in accordance with some embodiments.

As a comparison, in accordance with some embodiments of the present disclosure, when metal meshes 26MM and 36MM are staggered, height H3 is added to H2, while height H4 may be added to height H1. As a result, the top surface of dielectric layer 38 in accordance with the embodiments of the present disclosure has much smaller topology than if metal mesh 36MM is vertically aligned to metal mesh 26MM. The voids underlying DAF 52 may be eliminated, or may be reduce if they are formed. In the resulting structure, as shown in FIG. 27, the shrinkage of DAF 52 toward center will be reduced or eliminated.

Figure 9:
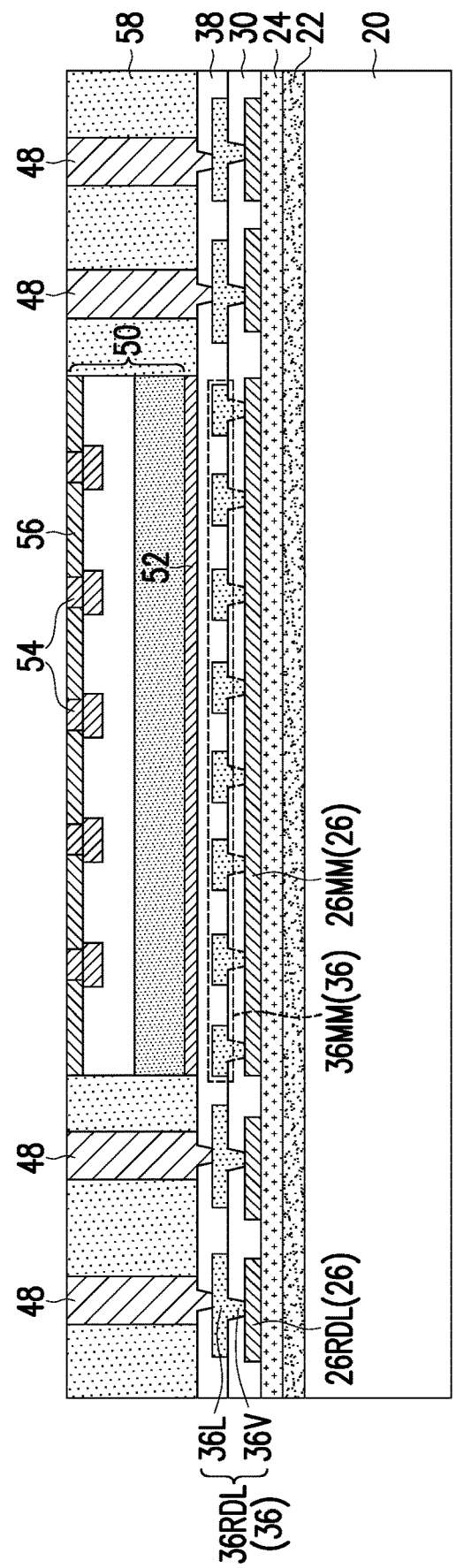

Next, as shown in FIG. 9, encapsulant 58 is dispensed to encapsulate package component 50 and metal posts 48 therein. The respective process is illustrated as process 220 in the process flow 200 shown in FIG. 29. Encapsulant 58 fills the gaps between neighboring metal posts 48 and package component 50. Encapsulant 58 may include a molding compound, a molding underfill, an epoxy, a resin, and/or the like. At the time of encapsulation, the top surface of encapsulant 58 is higher than the top ends of metal posts 48 and the top surface of package component 50. The molding compound or molding underfill (if used) may include a base material, which may be a polymer, a resin, an epoxy, or the like, and filler particles in the base material. The filler particles may be dielectric particles of silica, alumina, boron nitride, or the like, and may have spherical shapes. A planarization process such as a Chemical Mechanical Polish (CMP) process or a mechanical grinding process is then performed to thin encapsulant 58 and package component 50, until both of electrical connectors 54 and metal posts 48 are revealed. Due to the planarization process, the top ends of electrical connectors 54 and metal posts 48 are level (coplanar) with the top surfaces of encapsulant 58. Metal posts 48 are alternatively referred to as through-vias 48 hereinafter since they penetrate through encapsulant 58.

Figure 10:
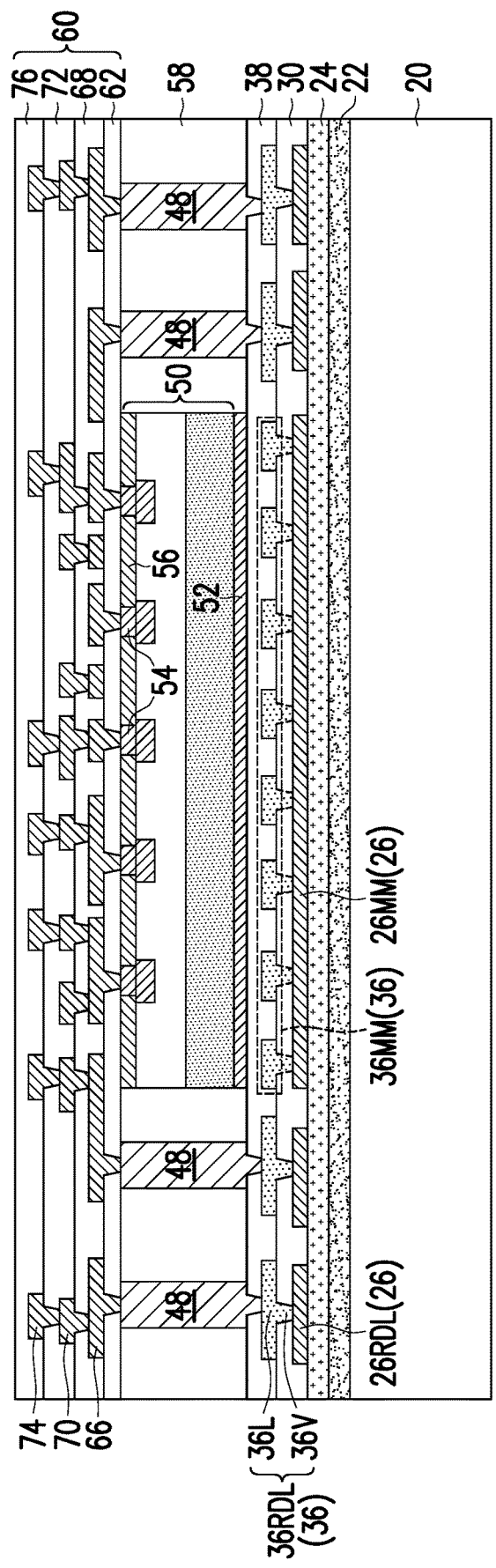
Figure 11:
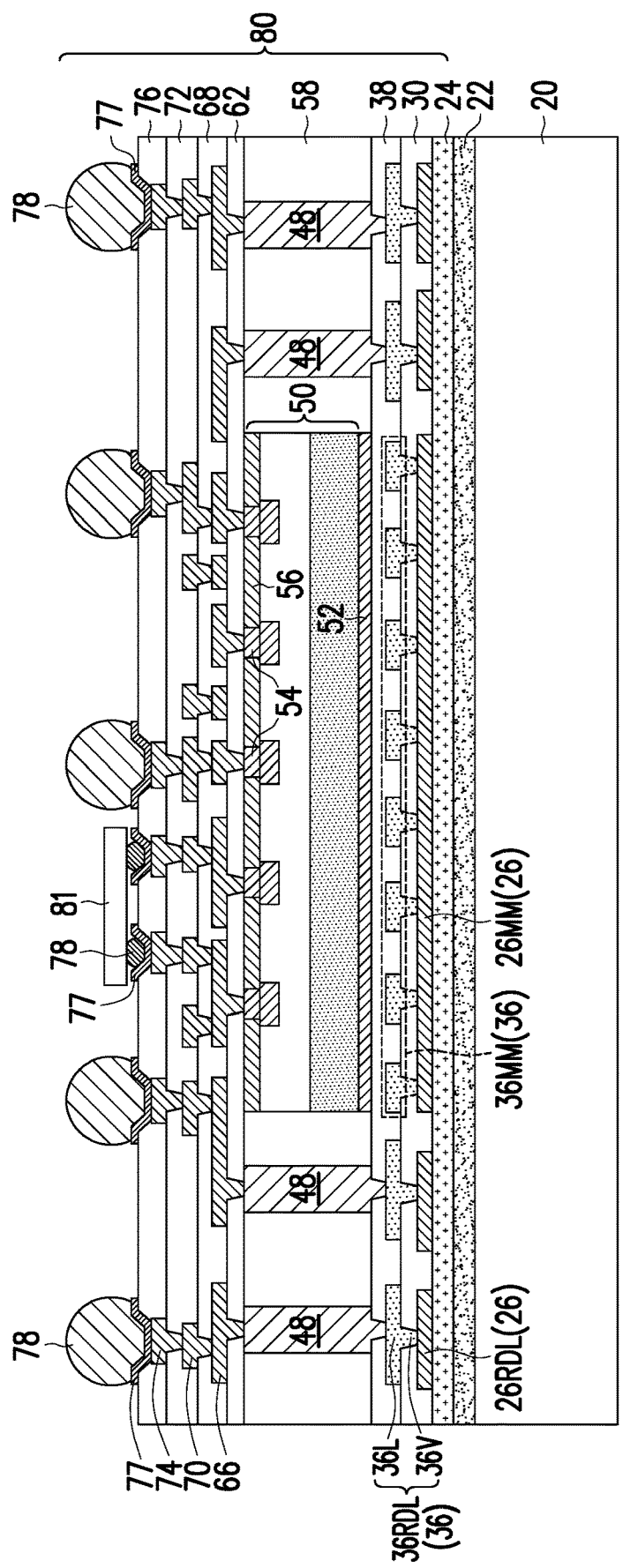
Figure 12:
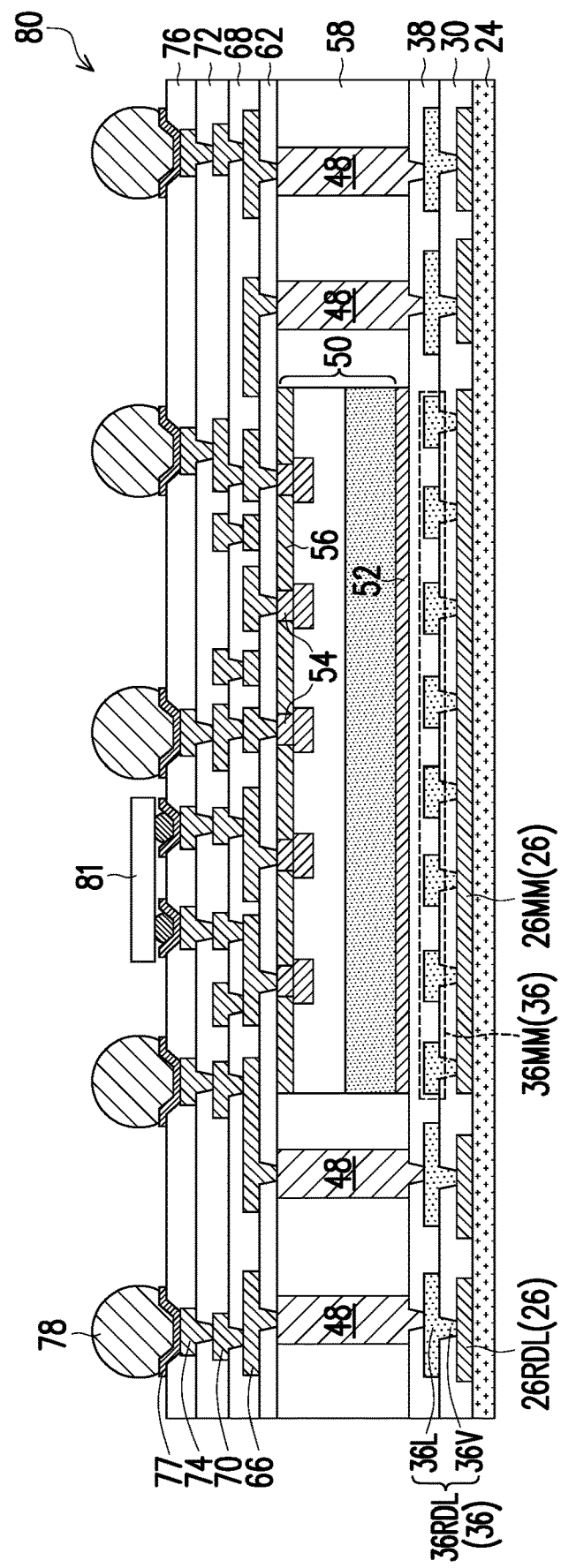

FIGS. 10 through 12 illustrate the formation of a front-side interconnect structure overlying and connecting to package component 50 and metal posts 48. Referring to FIG. 10, dielectric layer 62 is formed. In accordance with some embodiments of the present disclosure, dielectric layer 62 is formed of or comprises a polymer such as PBO, polyimide, BCB, or the like. The formation process includes coating dielectric layer 62 in a flowable form, and then curing dielectric layer 62. In accordance with alternative embodiments of the present disclosure, dielectric layer 62 is formed of an inorganic dielectric material such as silicon nitride, silicon oxide, or the like. The formation method may include CVD, Atomic Layer Deposition (ALD), Plasma-Enhanced Chemical Vapor Deposition (PECVD), or another applicable deposition method.

Openings (occupied by the via portions of RDLs 66) are then formed, for example, through a photo lithography process. Through-vias 48 and electrical connectors 54 are exposed through the openings. Next, RDLs 66 are formed. The formation process may be similar to the formation of conductive features 26 and 36. RDLs 66 are electrically connected to electrical connectors 54 and through-vias 48.

FIG. 10 further illustrates the formation of dielectric layers 68, 72, and 76, and RDLs 70 and 74. In accordance with some embodiments of the present disclosure, dielectric layers 68, 72, and 76 are formed of materials selected from the same or similar group of candidate materials for forming dielectric layers 30 and 38, and may include organic materials or inorganic materials. Throughout the description, RDLs 66, 70 and 74 and dielectric layers 62, 68, 72, and 76 are collectively referred to as front-side interconnect structure 60.

FIG. 11 illustrates the formation of Under-Bump Metallurgies (UBMs) 77 and electrical connectors 78 in accordance with some embodiments. The respective process is illustrated as process 224 in the process flow 200 shown in FIG. 29. To form UBMs 77, openings are formed in dielectric layer 76 to expose the underlying metal pads, which are parts of RDLs 74 in the illustrative embodiments. UBMs 77 may be formed of nickel, copper, titanium, or multi-layers thereof. UBMs 77 may include a titanium layer and a copper layer over the titanium layer.

Electrical connectors 78 are then formed on UBMs 77. The formation of electrical connectors 78 may include placing solder balls on the exposed portions of UBMs 77, and then reflowing the solder balls, and hence electrical connectors 78 are solder regions. In accordance with alternative embodiments of the present disclosure, the formation of electrical connectors 78 includes performing a plating process to form solder layers, and then reflowing the solder layers. Electrical connectors 78 may also include non-solder metal pillars, or metal pillars and solder caps over the non-solder metal pillars, which may also be formed through plating. Throughout the description, the structure over release film 22 is referred to as reconstructed wafer 80.

In accordance with some embodiments of the present disclosure, Independent Passive Device (IPD) 81 may be bonded to reconstructed wafer 80 through some of electrical connectors 78. IPD 81 may be or may comprise a passive device such as a capacitor die, an inductor die, a resistor die, or the like, or may include the combinations of the passive devices.

Next, reconstructed wafer 80 is de-bonded from carrier 20. The respective process is illustrated as process 226 in the process flow 200 shown in FIG. 29. In accordance with some embodiments, a light beam (which may be a laser beam) is projected on release film 22, and the light beam penetrates through the transparent carrier 20. Release film 22 is thus decomposed. Carrier 20 may be lifted off from release film 22, and hence reconstructed wafer 80 is de-bonded (de-mounted) from carrier 20. The de-bonded reconstructed wafer 80 is shown in FIG. 12

Figure 13:
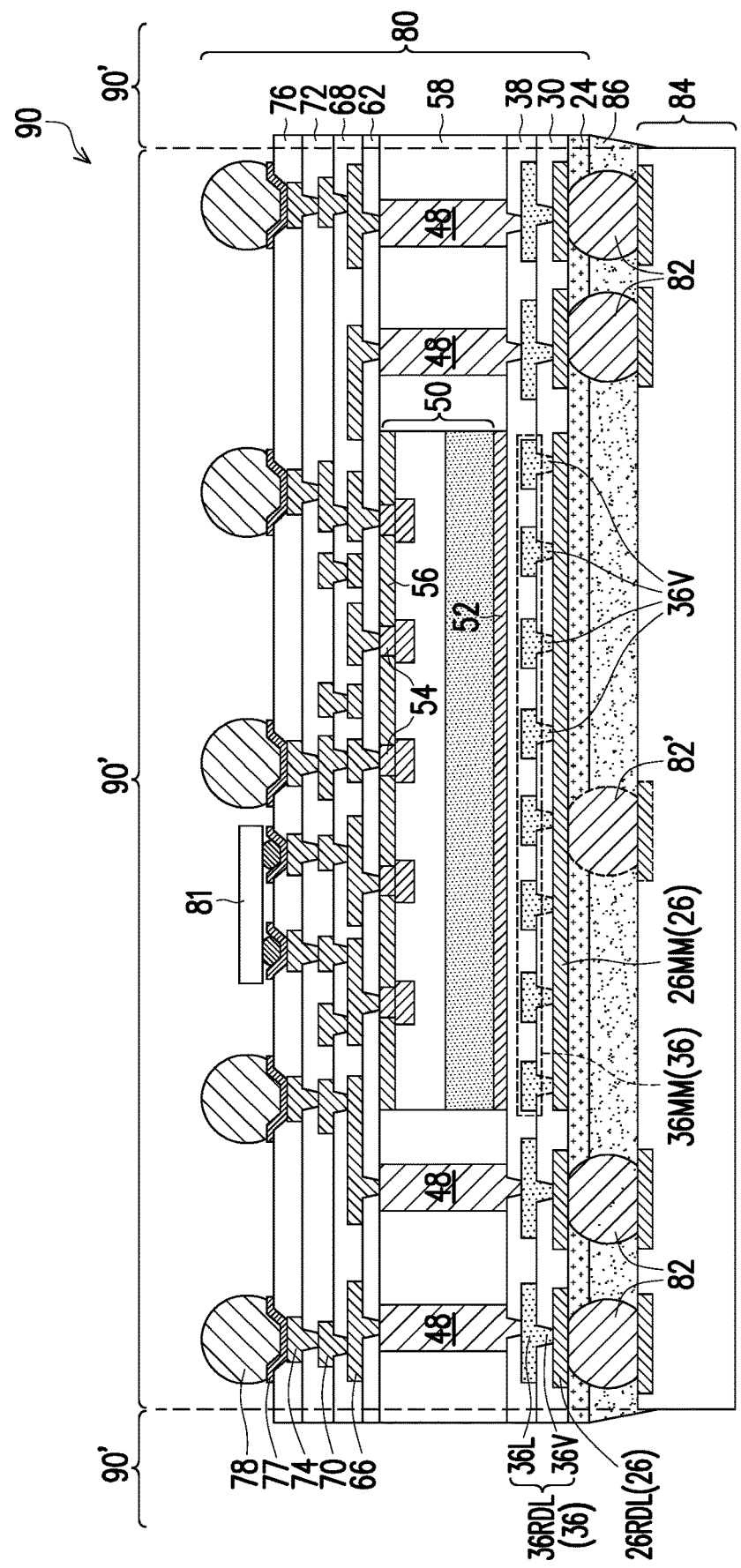

FIG. 13 illustrates the formation of electrical connectors 82 penetrating through dielectric layer 24 to contact RDLs 26RDL. The respective process is illustrated as process 228 in the process flow 200 shown in FIG. 29. In accordance with some embodiments, openings (occupied by electrical connectors 82) are formed in dielectric layer 24. The formation process may include a laser drill process performed using a laser beam, wherein RDLs 26RDL act as the stop layers for the laser drill. Some portions of RDLs 26RDL are exposed through the openings. Electrical connectors 82 are formed extending into the openings. In accordance with some embodiments, electrical connectors 82 are formed of or comprise solder. In accordance with alternative embodiments, electrical connectors 82 are formed of or comprise metal pads, metal pillars, or the like, and may or may not include solder.

Metal meshes 26MM and 36MM may act as the reinforcement structure for the package, and has the function of reducing pattern loading effect in the formation of RDLs 26RDL and 36RDL. In accordance with some embodiments, no electrical connector is formed to join to metal mesh 26MM. In accordance with alternative embodiments, an electrical connector 82' is formed to contact, and is electrically connected to, metal mesh 26MM. Electrically connector 82' is illustrated using dashed lines to indicate that it may, or may not, be formed. Electrical connector 82' may be a dummy feature, which is not for conducting current.

In accordance with some embodiments of the present disclosure, no vias 36V are formed to interconnect metal meshes 26MM and 36MM. Accordingly, each of metal meshes 26MM and 36MM is fully enclosed in dielectric materials, and are electrically floating. In accordance with alternative embodiments, vias 36V are formed to join metal mesh 26MM with metal mesh 36MM. Accordingly, metal meshes 26MM and 36MM are in an integrated conductive feature including metal meshes 26MM and 36MM and vias 36V.

In yet alternative embodiments, metal mesh 26MM is electrically grounded through electrical connector 82', or connected to a positive power supply node (such as VDD). Accordingly, metal mesh 36MM may be electrically grounded (or VDD) through electrical connector 82' when vias 36V are formed, or electrically floating when vias 36V are not formed. When metal mesh 26MM is electrically connected to the electrical ground or VDD, no current flows through metal mesh 26MM. In accordance with these embodiments, metal mesh 36MM is a terminal node of the corresponding electrical path, where electrical connection ends in metal mesh 36MM.

Next, as also shown in FIG. 13, package component 84 is bonded to reconstructed wafer 80 through electrical connectors 82. The respective process is illustrated as process 230 in the process flow 200 shown in FIG. 29. Although one package component 84 is illustrated, there may be a plurality of identical package components 84 bonded to reconstructed wafer 80. In accordance with some embodiments, package component 84 is a device die, a package, or the like. Underfill 86 may be dispensed between package component 84 and reconstructed wafer 80. In subsequent discussion, reconstructed wafer 80 and the package components 84 bonded thereon are collectively referred to as reconstructed wafer 90.

Next, reconstructed wafer 90 is placed on a dicing tape (not shown), which is attached to a frame (not shown). In accordance with some embodiments of the present disclosure, reconstructed wafer 90 is singulated in a die-saw process, for example, using a blade, and is separated into discrete packages 90'. The respective process is illustrated as process 232 in the process flow 200 shown in FIG. 29.

Figure 14:
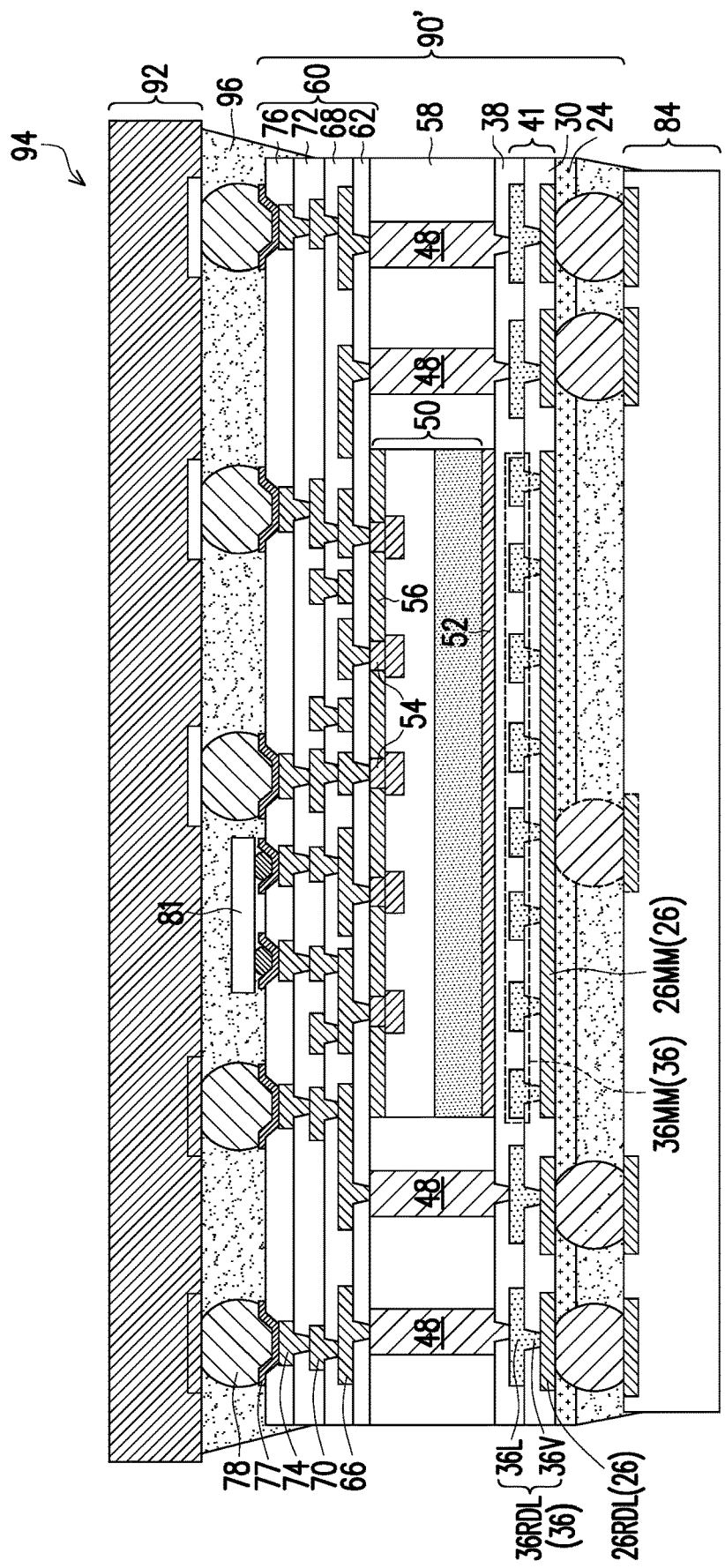

FIG. 14 illustrates the bonding of package 90' with package component 92 to form package 94. The respective process is illustrated as process 234 in the process flow 200 shown in FIG. 29. In accordance with some embodiments, package component 92 is or comprises a package substrate, an interposer, another package, or the like. Underfill 96 may be dispensed into the gap between package 90' and package component 92. It is appreciated that the positions of package components 84 and 92 may be swapped, and the sequence of bonding them may also be inversed.

In accordance with some embodiments, metal meshes 26MM and 36MM are overlapped by a majority (such as more than 70 percent, for example) of package component 50. Metal mesh 26MM may also have edges vertically aligned to, extending laterally beyond, or laterally recessed from, the respective edges of the overlying package component 50. In accordance with some embodiments, there is no RDL (for routing electrical signals) directly underlying package component 50, and metal meshes 26MM and 36MM occupy all the areas (in the corresponding layers) overlapped by package component 50.

Figure 18:
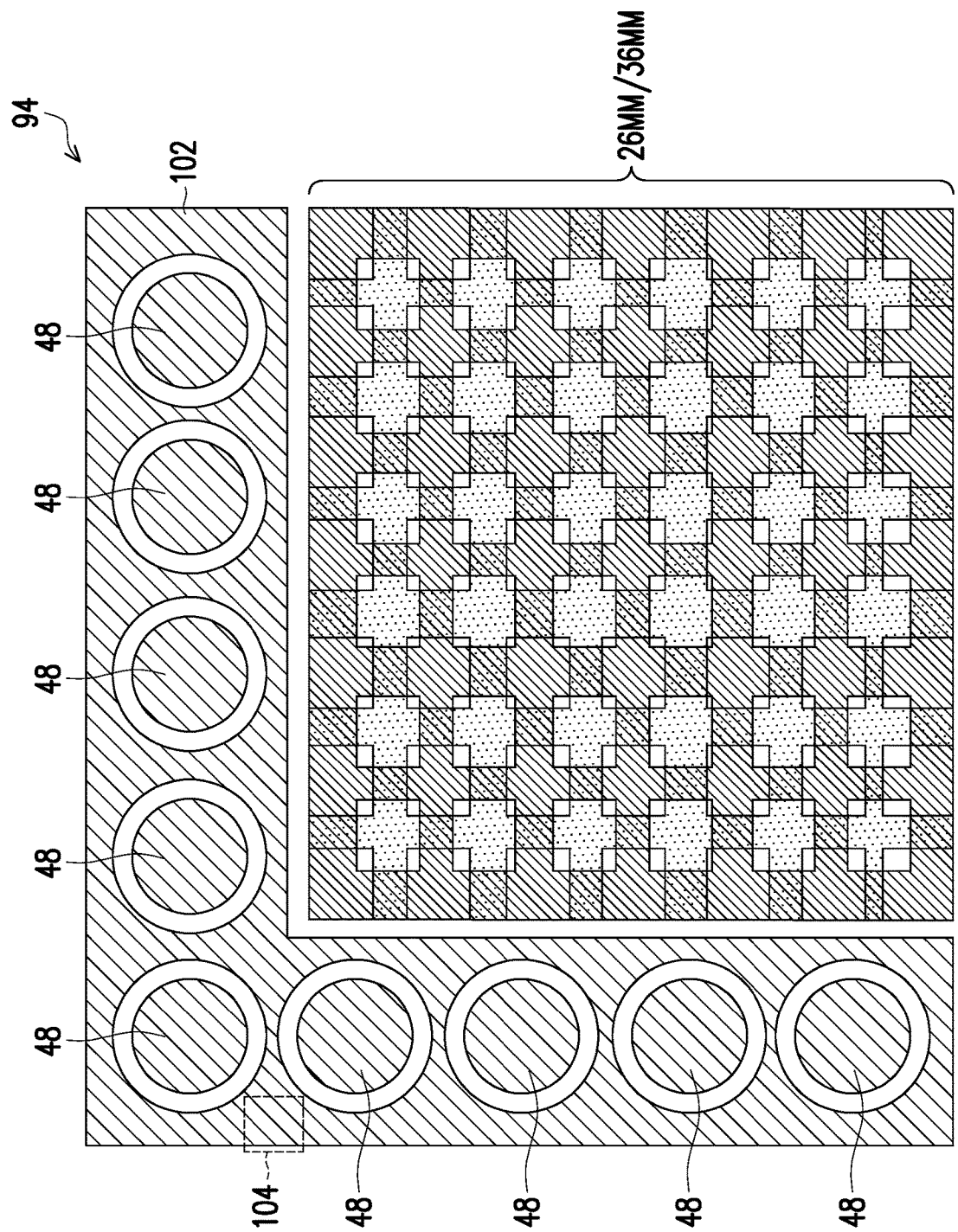
FIG. 18 illustrates a top view of a device die and staggered metal meshes and nearby through-vias in accordance with some embodiments.

FIG. 18 illustrates a top view of package 94 in accordance with some embodiments. The top view shows a part of metal meshes 26MM and 36MM, and some of through-vias 48. In accordance with some embodiments of the present disclosure, in metal layers 26 and 36, there are also dummy features 102 formed. In the top view, the dummy features 102 may surround through-vias 48, and may or may not extend directly underlying through-vias 48. The dummy features 102 are electrically disconnected from through-vias 48, RDLs 36RDL and 36RDL, and metal meshes 26MM and 36MM.

Figure 19:
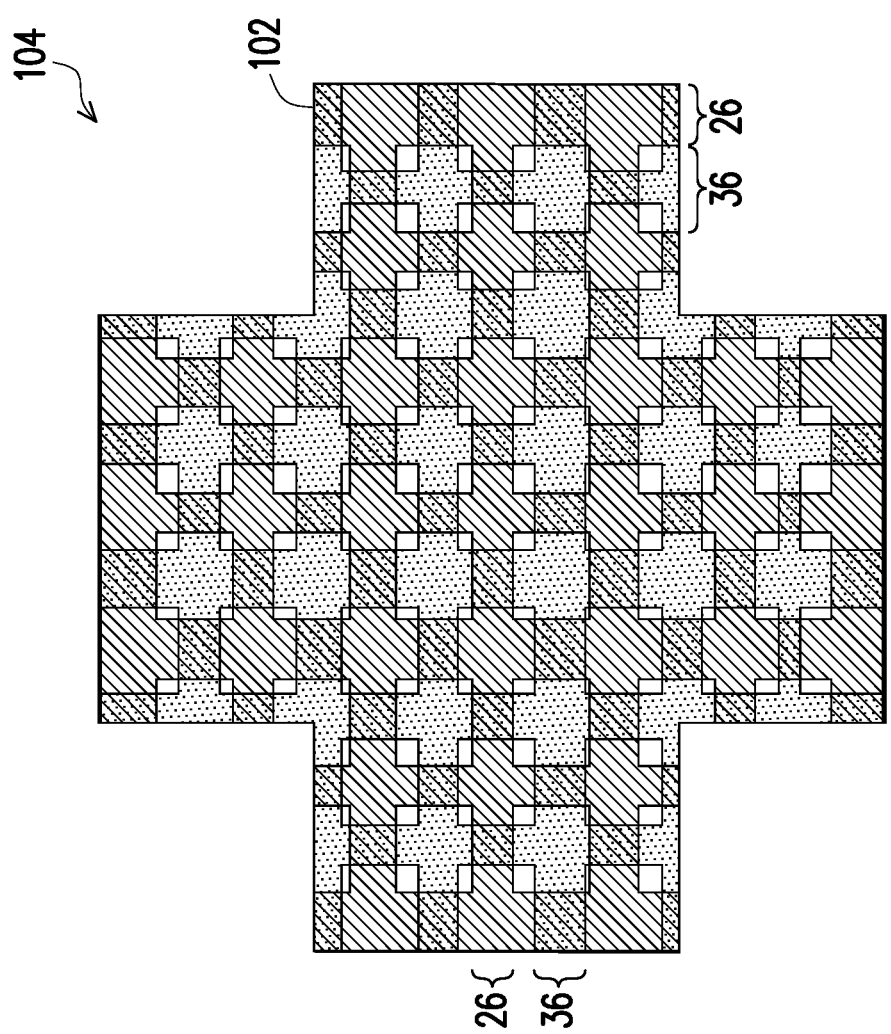
FIGS. 19 and 20 illustrate the top views of dummy metal regions near through-vias in accordance with some embodiments.
Figure 20:
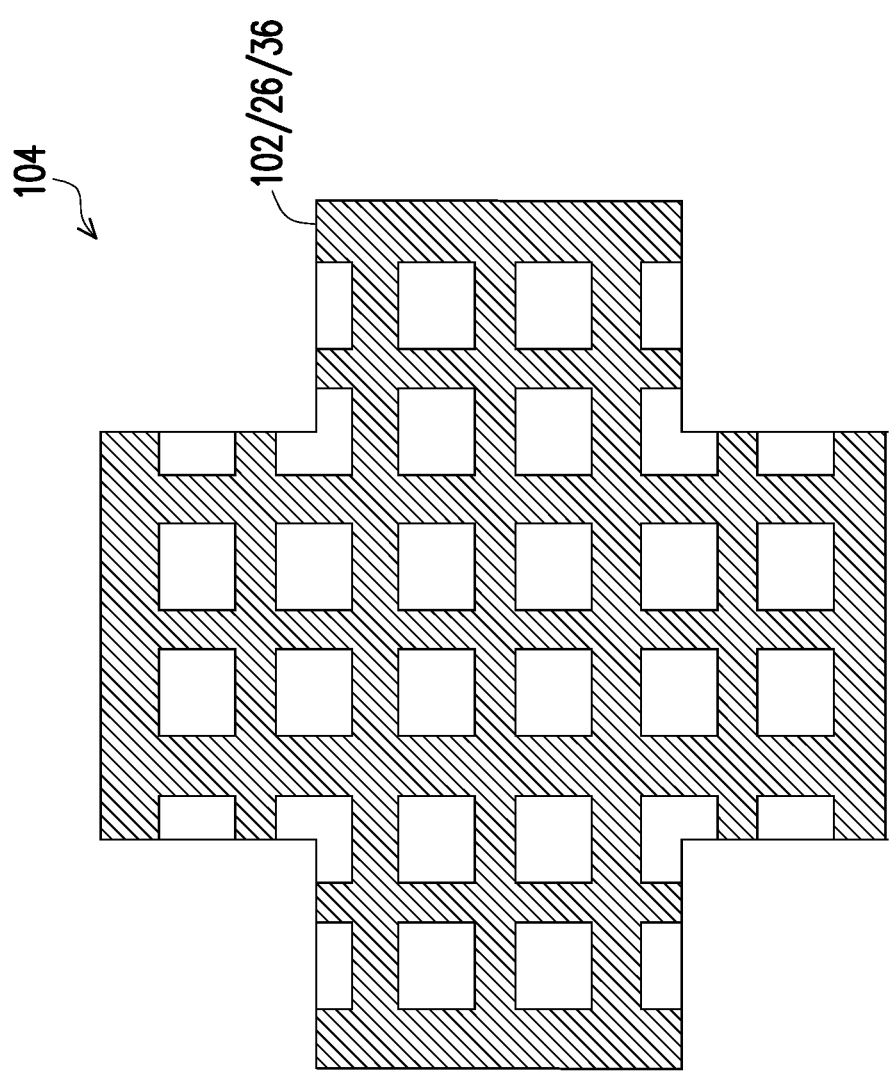

FIGS. 19 and 20 illustrate some example embodiments of the dummy features 102. The structure in FIGS. 19 and 20 may be the magnified view of region 104 in FIG. 18. In FIG. 19, the dummy features 102 in metal layers 26 and 36 are staggered, similar to the patterns in staggered metal meshes. Alternatively stated, the dummy features 102 in metal layer 26 have openings overlapped by the crossing areas of the dummy features 102 in metal layer 36, and the dummy features 102 in metal layer 36 have openings overlapping the crossing areas of the dummy features 102 in metal layer 26.

In accordance with alternative embodiments of the present disclosure, as shown in FIG. 20, the dummy features 102 in metal layers 26 and 36 are fully overlapped. Alternatively stated, the dummy features 102 in metal layer 26 have openings overlapped by (and may have same sizes as) the openings in the dummy features 102 in metal layer 36, and the dummy features 102 in metal layer 26 have crossing areas overlapped by (and may have same sizes as) the crossing areas of the dummy features 102 in metal layer 26. Since no package components are adhered directly over dummy features 102, the topology of the dielectric layer may not have adverse effect, and the layout in FIG. 20 may be adopted.

Figure 21:
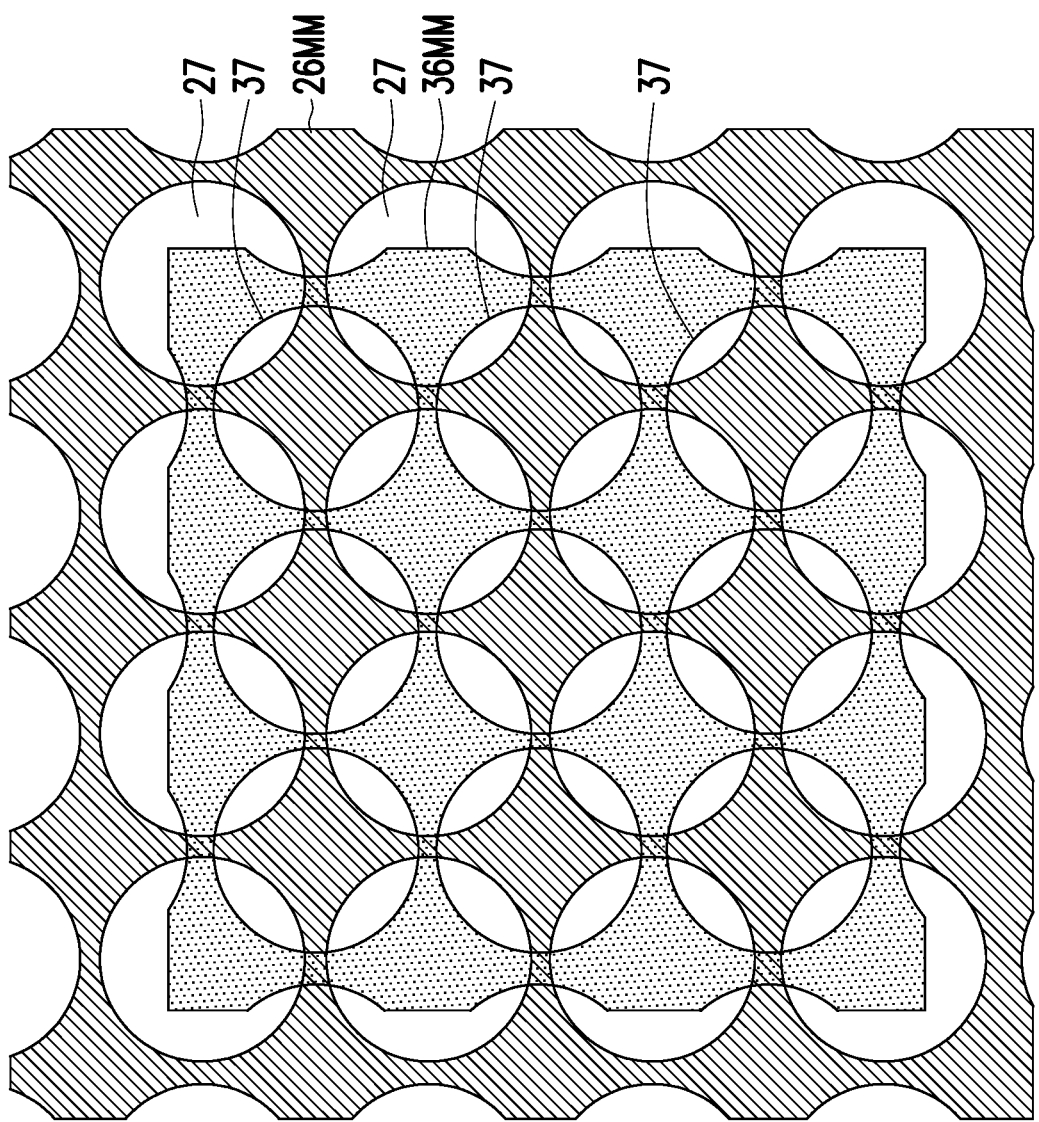
FIGS. 21-24 illustrate the top views of staggered metal meshes in accordance with some embodiments.

FIG. 21 illustrates metal meshes 26MM and 36MM in accordance with some embodiments of the present disclosure. In these embodiments, the openings 27 and 37, instead of having rectangular shapes, have rounded shapes. In accordance with other embodiments, openings 27 and 37 may have other shapes including and not limited to, rectangular shapes, ovals, hexagons, octagons, and the like.

Figure 22:
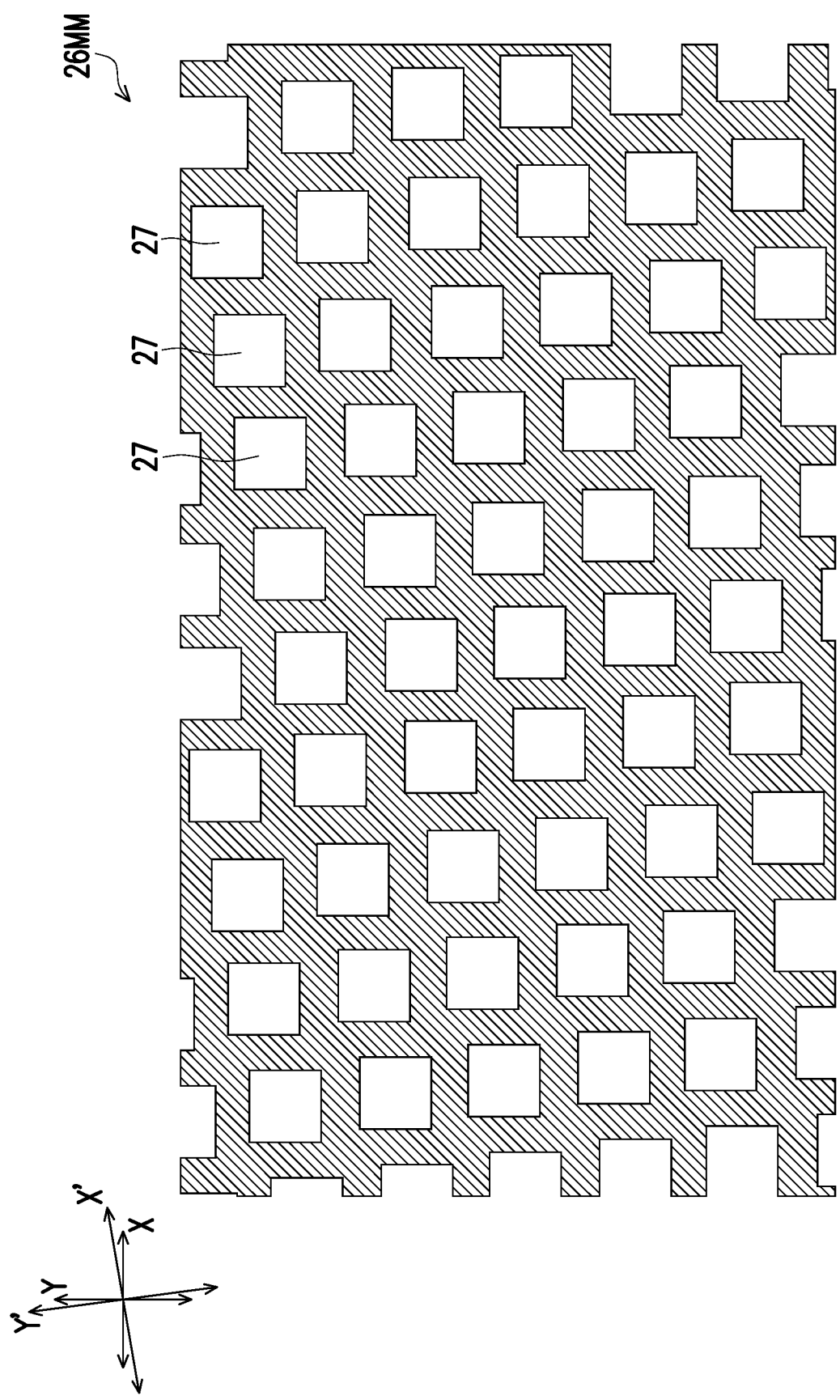
Figure 23:
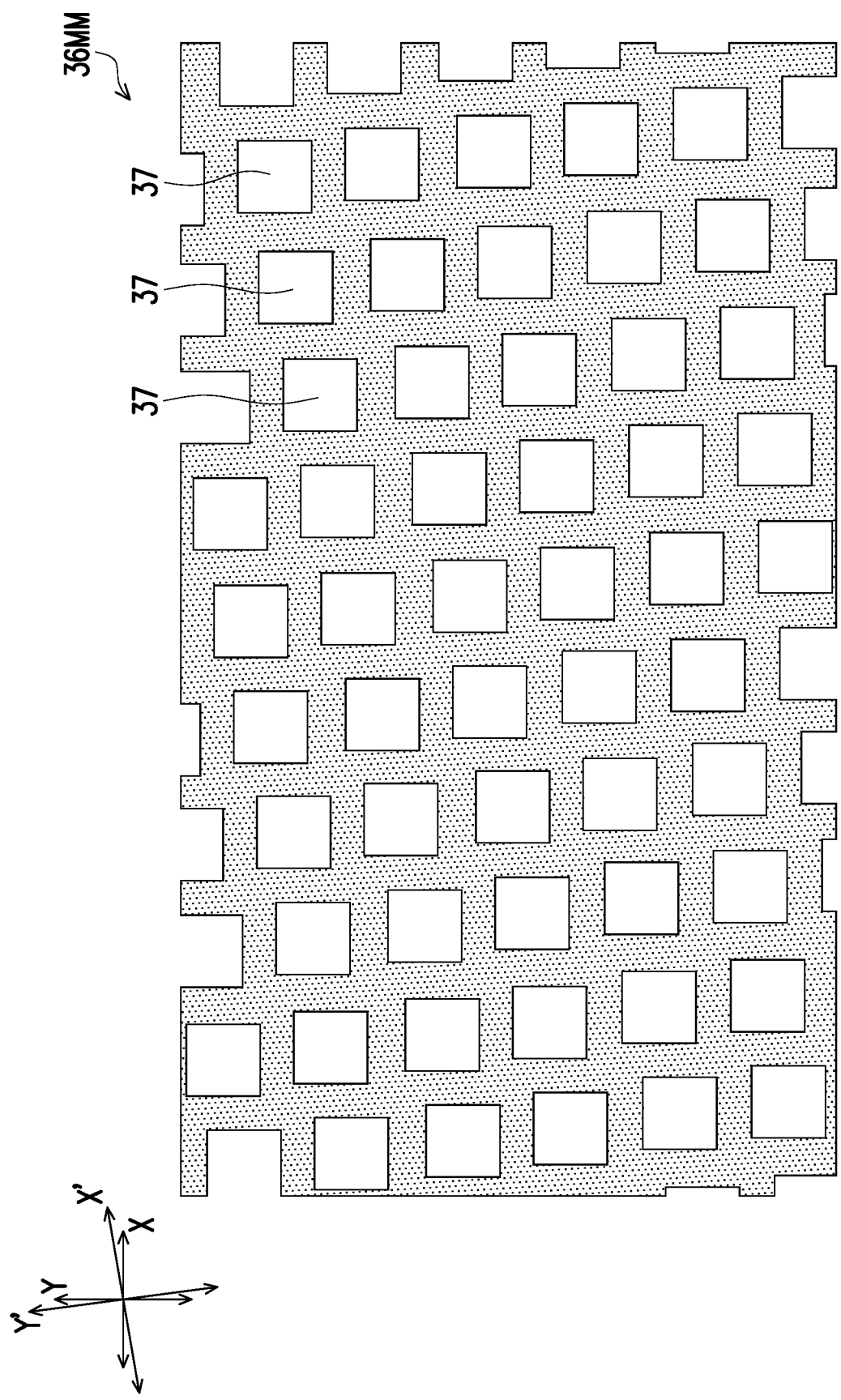
Figure 24:
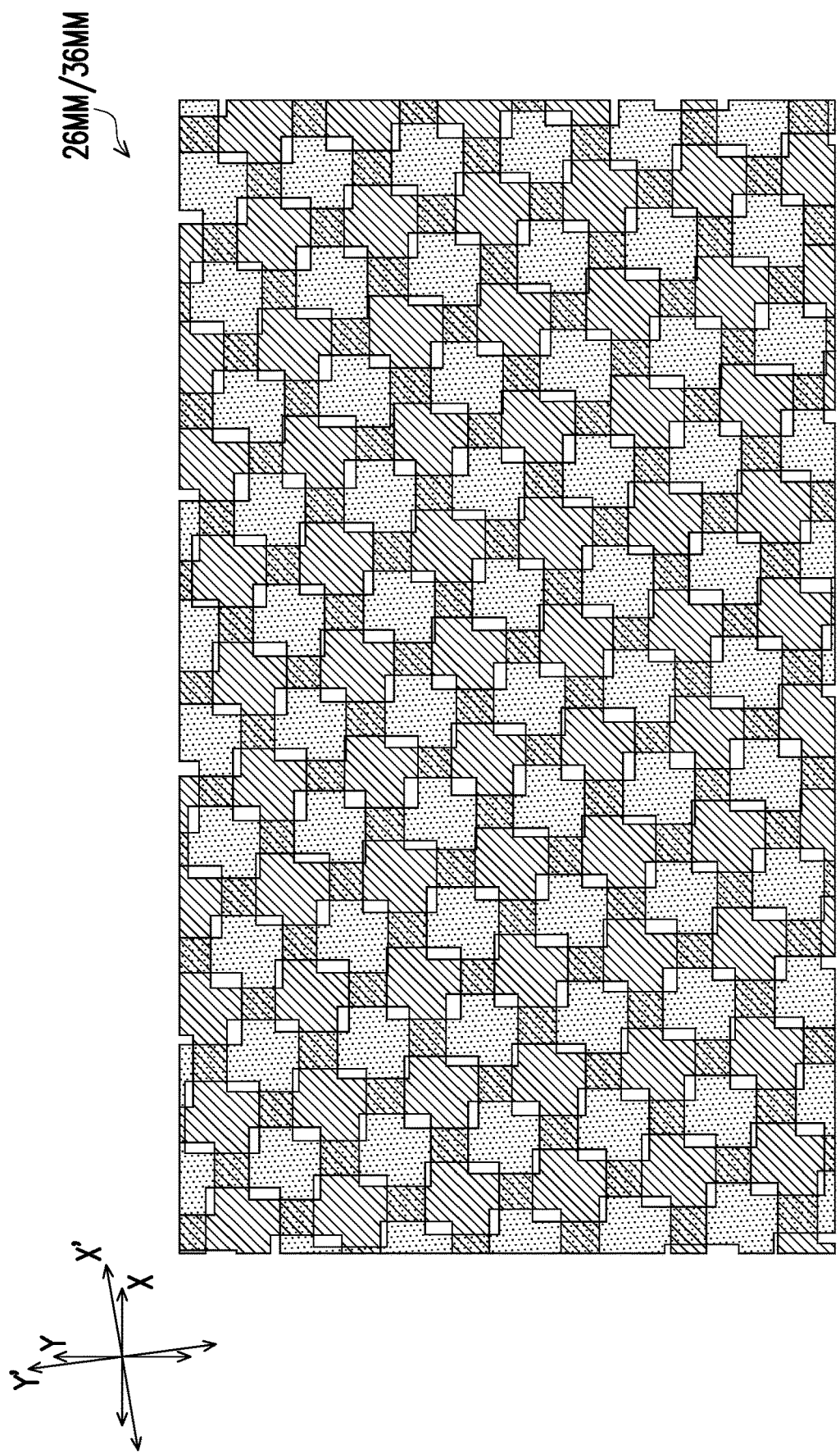

FIGS. 22-24 illustrates metal meshes 26MM and 36MM in accordance with alternative embodiments of the present disclosure. FIGS. 22 and 23 illustrate the top views of metal meshes 26MM and 36MM, respectively. FIG. 24 illustrates the staggered metal meshes 26MM and 36MM. In these embodiments, the lengthwise directions of the metal strips in metal meshes 26MM and 36MM are parallel to the X-direction and Y-direction, which are perpendicular to each other. The centers of openings 27 and 37, however, and aligned to directions X' and Y', which are rotated from the X-direction and Y-directions, respectively. The rotating angle may be in the range between about 5 degrees and about 15 degrees, for example.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In above-discussed example embodiments, two metal layers 26 and 36 are discussed as an example. In accordance with other embodiments, there may be three, four, or more metal layers. For example, assuming there is an additional metal layer ML (not shown) over metal layer 36. The additional metal layer ML may also include a metal mesh (denoted as ADMM (not shown) hereinafter) overlapped by package component 50. In accordance with these embodiments, any two, and possibly all of metal mesh pairs 26MM-36MM, 36MM-ADMM, and ADMM-26MM are staggered.

Figure 28:
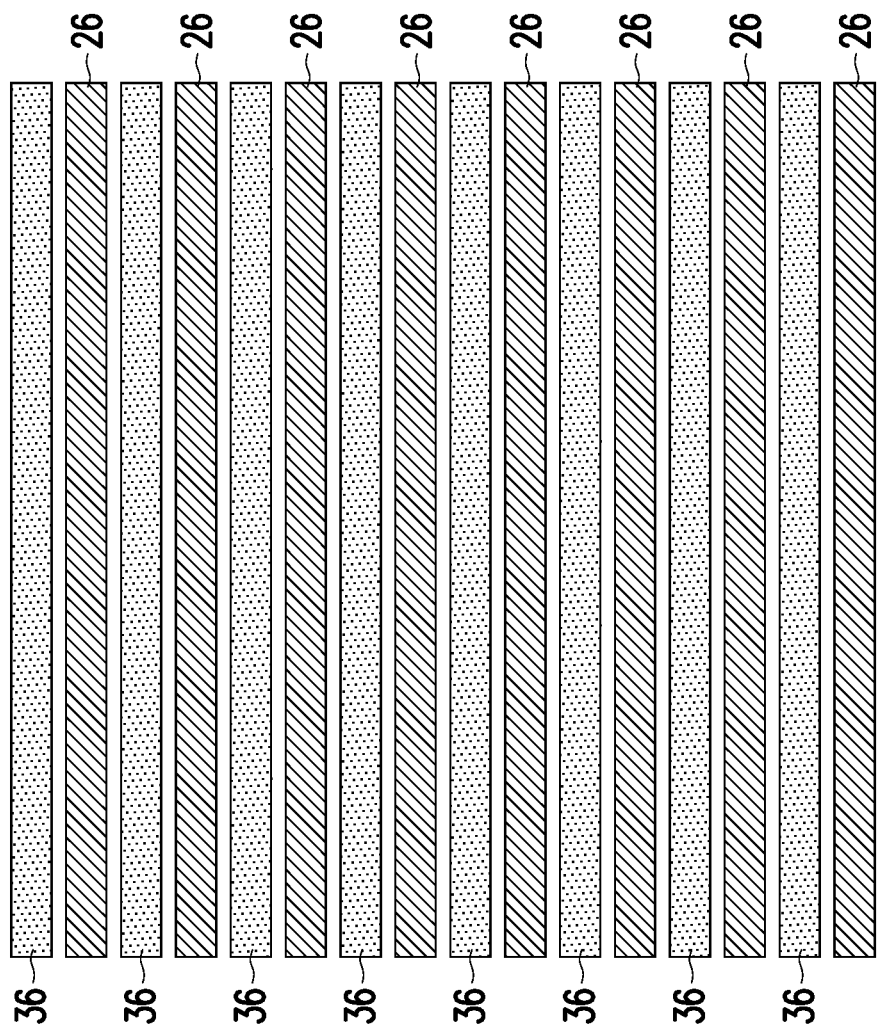
FIG. 28 illustrates a top view of a package including staggered metal strips in accordance with some embodiments

It is realized that the conductive feature overlapped by package component 50 may have other shapes other than metal meshes. For example, FIG. 28 illustrates an example top view of "metal mesh" (which are actually not metal meshes) in accordance with alternative embodiments. In these embodiments, the metal features 26MM and 36MM overlapped by package component 50, instead of forming metal meshes, have the shapes of parallel metal strips. Metal features 26MM and 36MM are also staggered.

In accordance with some embodiments, by adopting the embodiments of the present disclosure, the top surface of dielectric layer 38 has a local topology smaller than 1 µm, and a global topology smaller than 3 µm or 2 µm. The local topology is the maximum height difference between the top surfaces of the portion of dielectric layer overlapping metal meshes 26MM and 36MM, while the global topology is the maximum height difference of the top surfaces of the dielectric layer 38 in the entire die. As a comparison, if metal meshes 26MM and 36MM are vertically aligned, the local topology is greater than 2 µm, and the global topology is greater than 4 µm. Experiment results have revealed that when the local topology is lower than 1 µm, and when the global topology is lower than 3 µm, no void will be formed between DAF 52 and dielectric layer 38 (FIG. 14).

The embodiments of the present disclosure have some advantageous features. By forming staggered metal meshes, the topology of the top dielectric layer in backside interconnect structure is reduced, and hence the void between the top dielectric layer and DAF is eliminated. The undesirable shrinkage of the DAF is also reduced. The shrinkage may result in cracks in RDLs. Accordingly, with staggered metal meshes, the reliability of the packages is improved.

In accordance with some embodiments of the present disclosure, a method comprises forming a first metal mesh over a carrier; forming a first dielectric layer over the first metal mesh; forming a second metal mesh over the first dielectric layer, wherein the first metal mesh and the second metal mesh are staggered; forming a second dielectric layer over the second metal mesh; attaching a device die over the second dielectric layer, wherein the device die overlaps the first metal mesh and the second metal mesh; encapsulating the device die in an encapsulant; and forming redistribution lines over and electrically connecting to the device die. In an embodiment, the first metal mesh comprises a first plurality of openings, and the second metal mesh comprises a second plurality of openings vertically misaligned from the first plurality of openings.

In an embodiment, wherein in a top view of the first metal mesh and the second metal mesh, a total density of the first metal mesh and the second metal mesh is smaller than 100 percent, wherein the total density is equal to a ratio of a total area of the first metal mesh and the second metal mesh to a sum of a first contour area occupied by the first metal mesh and a second contour area occupied by the second metal mesh. In an embodiment, the first metal mesh extends laterally to opposing edges of the device die. In an embodiment, the forming the first dielectric layer comprises dispensing a polymer layer. In an embodiment, the method further comprises forming a first dummy metal mesh in a same process as forming the first metal mesh; and forming a second dummy metal mesh in a same process as forming the second metal mesh, wherein the first dummy metal mesh and the second dummy metal mesh are vertically misaligned from the device die, and the first dummy metal mesh and the second dummy metal mesh are staggered.

In an embodiment, the method further comprises forming a first dummy metal mesh in a same process for forming the first metal mesh, wherein the first dummy metal mesh comprises a first array of openings; and forming a second dummy metal mesh in a same process for forming the second metal mesh, wherein the second dummy metal mesh comprises a second array of openings, and wherein the first array of openings vertically fully overlap the second array of openings. In an embodiment, the method further comprises forming a via extending into the second dielectric layer; and forming a metal post over and joined to the via, wherein the metal post is encapsulated in the encapsulant. In an embodiment, the first metal mesh and the second metal mesh are electrically floating. In an embodiment, the method further comprises forming electrical connectors to electrically grounding the first metal mesh and the second metal mesh.

In accordance with some embodiments of the present disclosure, a package comprises a first dielectric layer; a first metal mesh over the first dielectric layer; a second dielectric layer over the first metal mesh; a second metal mesh over the second dielectric layer, wherein the first metal mesh and the second metal mesh are staggered; a third dielectric layer over the second metal mesh; a die-attach film over and physically contacting the third dielectric layer, wherein the die-attach film overlaps the first metal mesh and the second metal mesh; a package component over and contacting the die-attach film; an encapsulant encapsulating the package component therein; and redistribution lines over and electrically connecting to the package component. In an embodiment, the first metal mesh comprises a first plurality of openings, and the second metal mesh comprises a second plurality of openings, and wherein the first plurality of openings are vertically offset from respective overlying second plurality of openings.

In an embodiment, one of the first plurality of openings has a same size as one of the second plurality of openings. In an embodiment, the first metal mesh comprises a first plurality of metal strips extending in a first direction and a second plurality of metal strips extending in a second direction, and wherein the first plurality of metal strips form crossing areas with the second plurality of metal strips, and wherein first centers of the crossing areas vertically are overlapped by second centers of the second plurality of openings. In an embodiment, the first metal mesh and the second metal mesh are electrically floating. In an embodiment, the first metal mesh and the second metal mesh are electrically grounded.

In accordance with some embodiments of the present disclosure, a package comprises a first metal plate comprising a first plurality of openings, wherein the first plurality of openings comprise first centers; a second metal plate overlapping the first metal plate, the second metal plate comprising a second plurality of openings, wherein the second plurality of openings comprise second centers, and wherein the first centers of the first plurality of openings are vertically offset from the second centers of the second plurality of openings; a dielectric layer over the second metal plate and extending into the second plurality of openings; and a device die overlapping the first metal plate and the second metal plate.

In an embodiment, the first plurality of openings form a first array, and the second plurality of openings form a second array. In an embodiment, the first centers are vertically aligned to corresponding middle points between neighboring ones of the second plurality of openings. In an embodiment, the package further comprises a die-attach film over and physically contacting the dielectric layer, wherein the device die is over and physically contacting the die-attach film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first metal mesh over a carrier;
    forming a first dielectric layer over the first metal mesh;
    forming a second metal mesh over the first dielectric layer, wherein the first metal mesh and the second metal mesh are staggered, and wherein each of the first metal mesh and the second metal mesh comprises:
        a first plurality of metal strips having first lengthwise directions parallel to each other;
        a second plurality of metal strips having second lengthwise directions parallel to each other, wherein the first plurality of metal strips and the second plurality of metal strips are joined to form a continuous metal region;
    forming a second dielectric layer over the second metal mesh;
    attaching a device die over the second dielectric layer, wherein the device die overlaps the first metal mesh and the second metal mesh;
    encapsulating the device die in an encapsulant; and
    forming redistribution lines over and electrically connecting to the device die.

2. The method of claim 1, wherein the first metal mesh comprises a first plurality of openings, and the second metal mesh comprises a second plurality of openings vertically misaligned from the first plurality of openings.

3. The method of claim 2, wherein in a top view of the first metal mesh and the second metal mesh, a total density of the first metal mesh and the second metal mesh is smaller than 100 percent, wherein the total density is equal to a ratio of a total area of the first metal mesh and the second metal mesh to a sum of a first contour area occupied by the first metal mesh and a second contour area occupied by the second metal mesh.

4. The method of claim 1, wherein the first metal mesh extends laterally to opposing edges of the device die.

5. The method of claim 1, wherein the forming the first dielectric layer comprises dispensing a polymer layer.

6. The method of claim 1 further comprising:
    forming a first dummy metal mesh in a same process as forming the first metal mesh; and
    forming a second dummy metal mesh in a same process as forming the second metal mesh, wherein the first dummy metal mesh and the second dummy metal mesh are vertically misaligned from the device die, and the first dummy metal mesh and the second dummy metal mesh are staggered.

7. The method of claim 1 further comprising:
    forming a first dummy metal mesh in a same process for forming the first metal mesh, wherein the first dummy metal mesh comprises a first array of openings; and
    forming a second dummy metal mesh in a same process for forming the second metal mesh, wherein the second dummy metal mesh comprises a second array of openings, and wherein the first array of openings vertically fully overlap the second array of openings.

8. The method of claim 1 further comprising:
    forming a via extending into the second dielectric layer; and
    forming a metal post over and joined to the via, wherein the metal post is encapsulated in the encapsulant.

9. The method of claim 1, wherein the first metal mesh and the second metal mesh are electrically floating.

10. The method of claim 1 further comprising forming electrical connectors to electrically ground the first metal mesh and the second metal mesh.

11. A method comprising:
    forming a first metal mesh over a first dielectric layer;
    forming a second dielectric layer comprising:
        a first portion over the first metal mesh; and
        second portions in the first metal mesh, wherein the first metal mesh comprises first parts that fully encircle each of the second portions of the second dielectric layer;
    forming a second metal mesh over the second dielectric layer, wherein the first metal mesh and the second metal mesh are staggered;
    forming a third dielectric layer comprising:
        a third portion over the second metal mesh; and
        fourth portions in the second metal mesh, wherein the second metal mesh comprises second parts that fully encircle each of the fourth portions of the second dielectric layer;
    attaching a package component over the third dielectric layer through a die-attach film, wherein the package component overlaps the first metal mesh and the second metal mesh;
    encapsulating the package component in an encapsulant; and
    forming redistribution lines over and electrically connecting to the package component.

12. The method of claim 11, wherein the first metal mesh comprises a first plurality of openings, and the second metal mesh comprises a second plurality of openings, and wherein the first plurality of openings are vertically offset from respective overlying second plurality of openings.

13. The method of claim 12, wherein one of the first plurality of openings has a same size as one of the second plurality of openings.

14. The method of claim 12, wherein the first metal mesh comprises a first plurality of metal strips extending in a first direction and a second plurality of metal strips extending in a second direction, and wherein the first plurality of metal strips form crossing areas with the second plurality of metal strips, and wherein first centers of the crossing areas are vertically overlapped by second centers of the second plurality of openings.

15. The method of claim 11, wherein the first metal mesh and the second metal mesh are electrically floating.

16. The method of claim 11, wherein the first metal mesh and the second metal mesh are electrically grounded.

17. A method comprising:
forming a first metal plate comprising a first plurality of openings, wherein the first plurality of openings comprise first centers;
forming a second metal plate overlapping the first metal plate, the second metal plate comprising a second plurality of openings, wherein the second plurality of openings comprise second centers, and wherein the first centers of the first plurality of openings are vertically offset from the second centers of the second plurality of openings;
forming a dielectric layer over the second metal plate and extending into the second plurality of openings; and
attaching a device die overlapping the first metal plate and the second metal plate.

18. The method of claim 17, wherein the first plurality of openings form a first array, and the second plurality of openings form a second array.

19. The method of claim 17, wherein the first centers are vertically aligned to corresponding middle points between neighboring ones of the second plurality of openings.

20. The method of claim 17, wherein the device die is attached to the dielectric layer through a die-attach film.

* * * * *